(12) United States Patent
Wu et al.

(10) Patent No.: US 10,872,826 B2
(45) Date of Patent: Dec. 22, 2020

(54) FIN FIELD-EFFECT TRANSISTOR DEVICE AND METHOD

(71) Applicant: Taiwan Semiconductor Manufacturing Company, Ltd., Hsinchu (TW)

(72) Inventors: Shao-Jyun Wu, New Taipei (TW); Sheng-Liang Pan, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 55 days.

(21) Appl. No.: 16/252,282

(22) Filed: Jan. 18, 2019

(65) Prior Publication Data

US 2020/0135588 A1 Apr. 30, 2020

Related U.S. Application Data

(60) Provisional application No. 62/753,682, filed on Oct. 31, 2018.

(51) Int. Cl.
*H01L 21/8238* (2006.01)
*H01L 27/092* (2006.01)
*H01L 21/311* (2006.01)
*H01L 21/321* (2006.01)
*H01L 21/28* (2006.01)

(52) U.S. Cl.
CPC ........... *H01L 21/823842* (2013.01); *H01L 21/28088* (2013.01); *H01L 21/31138* (2013.01); *H01L 21/32105* (2013.01); *H01L 21/823821* (2013.01); *H01L 27/0924* (2013.01)

(58) Field of Classification Search
None
See application file for complete search history.

(56) References Cited

U.S. PATENT DOCUMENTS 8,729,627 B2 * 5/2014 Cheng ................... H01L 21/845
257/330
9,281,201 B2 * 3/2016 Guo ..................... H01L 29/4966
(Continued)

FOREIGN PATENT DOCUMENTS

KR 20160139814 A 12/2016
KR 101785803 B1 10/2017
(Continued)

*Primary Examiner* — Mounir S Amer
(74) *Attorney, Agent, or Firm* — Slater Matsil, LLP

(57) ABSTRACT

A method of forming a semiconductor device includes forming a first dummy gate structure and a second dummy gate structure over a fin; forming a first dielectric layer around the first dummy gate structure and around the second dummy gate structure; removing the first dummy gate structure and the second dummy gate structure to form a first recess and a second recess in the first dielectric layer, respectively; forming a gate dielectric layer in the first recess and the second recess; forming a first work function layer over the gate dielectric layer in the first recess and in the second recess; removing the first work function layer from the first recess; converting a surface layer of the first work function layer in the second recess into an oxide; and forming a second work function layer in the first recess over the gate dielectric layer and in the second recess over the oxide.

20 Claims, 25 Drawing Sheets

(56) References Cited

U.S. PATENT DOCUMENTS

| | | |
|---|---|---|
| 9,520,482 B1* | 12/2016 | Chang ............. H01L 21/823431 |
| 9,899,271 B2 | 2/2018 | Chang et al. |
| 9,947,540 B2 | 4/2018 | Tsai et al. |
| 10,622,482 B2* | 4/2020 | Greene ........... H01L 21/823462 |
| 10,784,260 B2* | 9/2020 | Park ...................... H01L 27/088 |
| 2015/0206953 A1 | 7/2015 | Basker et al. |
| 2016/0027664 A1* | 1/2016 | Ando .................. H01L 21/0273 |
| | | 438/591 |
| 2016/0225868 A1 | 8/2016 | Kim et al. |
| 2016/0343706 A1* | 11/2016 | Chang ............... H01L 21/32136 |
| 2016/0351568 A1 | 12/2016 | Chang et al. |
| 2016/0351569 A1 | 12/2016 | Song et al. |

FOREIGN PATENT DOCUMENTS

| | | |
|---|---|---|
| TW | 201436047 A | 9/2014 |
| TW | 201642326 A | 12/2016 |
| TW | 201705238 A | 2/2017 |

* cited by examiner

FIN FIELD-EFFECT TRANSISTOR DEVICE AND METHOD

PRIORITY CLAIM AND CROSS-REFERENCE

This application claims priority to U.S. Provisional Patent Application No. 62/753,682 filed Oct. 31, 2018, entitled "Fin Field-Effect Transistor Device and Method," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
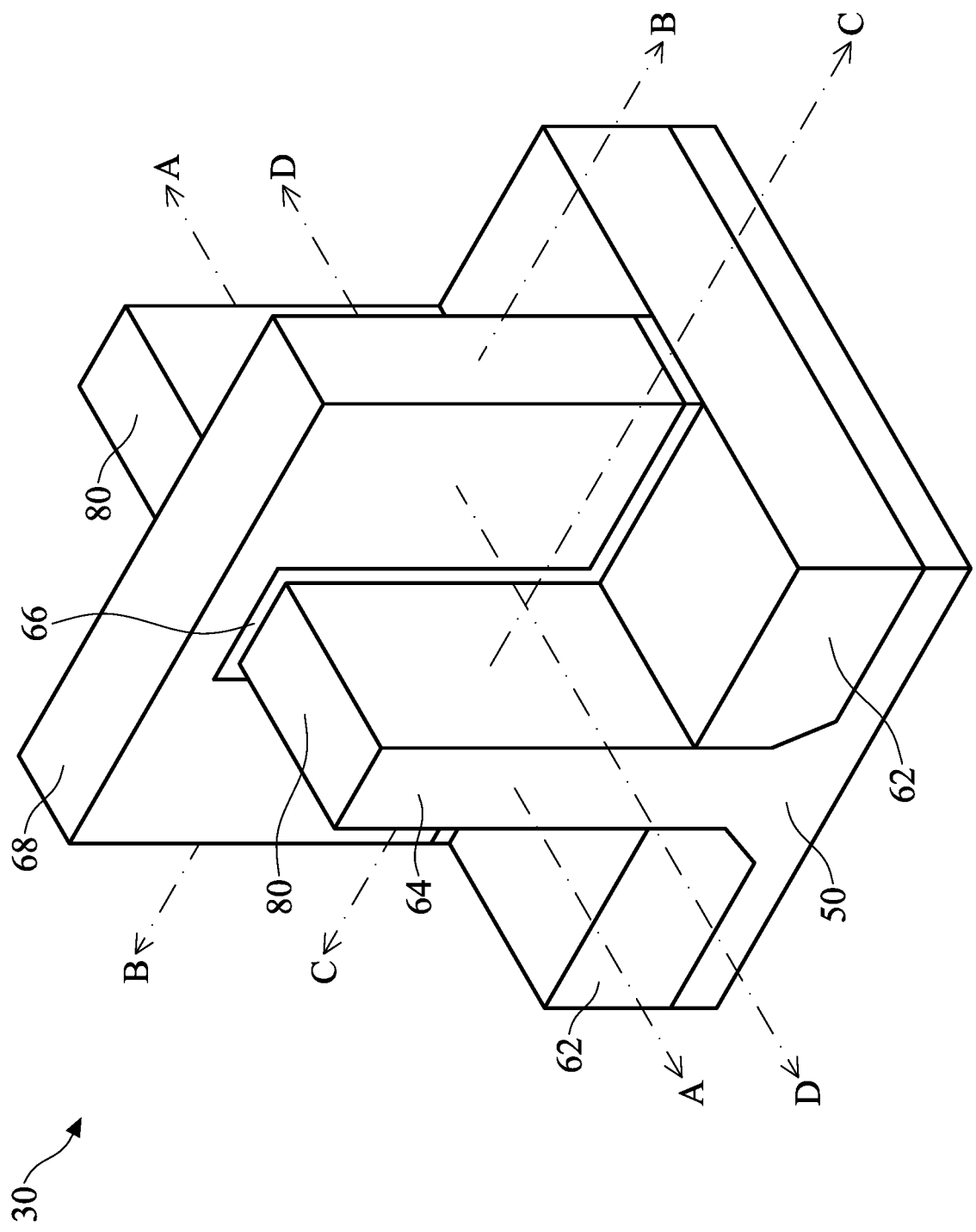
FIG. 1 is a perspective view of a Fin Field-Effect Transistor (FinFET), in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion, unless otherwise stated, the same reference numeral in different figures refers to the same or similar element formed by a same or similar process using a same or similar material(s).

Embodiments of the present disclosure are discussed in the context of forming a semiconductor device, and in particular, in the context of forming work function layers of a FinFET device during device fabrication. The present disclosure may also be used in other types of devices, such as planar devices.

In an embodiment, a first dummy gate structure and a second dummy gate structure are formed over a fin, and a dielectric layer (e.g., an inter-layer dielectric layer) is formed around the first dummy gate structure and around the second dummy gate structure. The first dummy gate structure and the second dummy gate structure are next removed to form a first recess and a second recess in the dielectric layer, respectively. A first work function layer (e.g., a p-type work function layer) is formed conformally to line sidewalls and bottoms of the first recess and the second recess. A patterned mask layer (e.g., a polymer layer such as a bottom anti-reflective coating (BARC) layer) is then formed to cover the first work function layer in the second recess and to expose the first work function layer in the first recess. The exposed first work function layer in the first recess is then removed by an etching process. Next, the patterned mask layer in the second recess is removed by a plasma process. In the illustrated embodiment, a composition of the patterned mask layer comprises oxygen, which oxygen is turned into active oxygen species by the plasma process. The oxygen species then reacts with a surface layer of the first work function layer in the second recess to convert the surface layer into an oxide (e.g., silicon oxide). Next, a second work function layer (e.g., an n-type work function layer) is formed in the first recess and in the second recess. In the illustrated embodiment, the second work function layer formed in the second recess is thicker than the second work function layer formed in the first recess, due to the oxide in the second recess being conducive to the deposition of the second work function layer. A fill metal is next formed to fill the first recess and the second recess to form a first metal gate and a second metal gate, respectively. In some embodiments, by changing the duration of the plasma process, or by changing a flow rate of nitrogen used in the plasma process, the thickness of the oxide layer is changed, which in turn changes the thickness of the second work function layer formed over the oxide layer. Therefore, the first metal gate and the second metal gate have different thicknesses for the second work function layer, which, together with the different structures of the first metal gate and the second metal gate, results in different threshold voltage Vt for the first metal gate and the second metal gate.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate 68 is over the gate dielectric 66. Source/drain regions 80 are in the fin 64 and on opposing sides of the gate dielectric 66 and the gate 68. FIG. 1 further illustrates reference cross-sections that are used in later figures. Cross-section B-B extends along a longitudinal axis of the gate 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80. Cross-section D-D is parallel to cross-section A-A and outside of the fin 64. Subsequent figures refer to these reference cross-sections for clarity.

Figure 15:
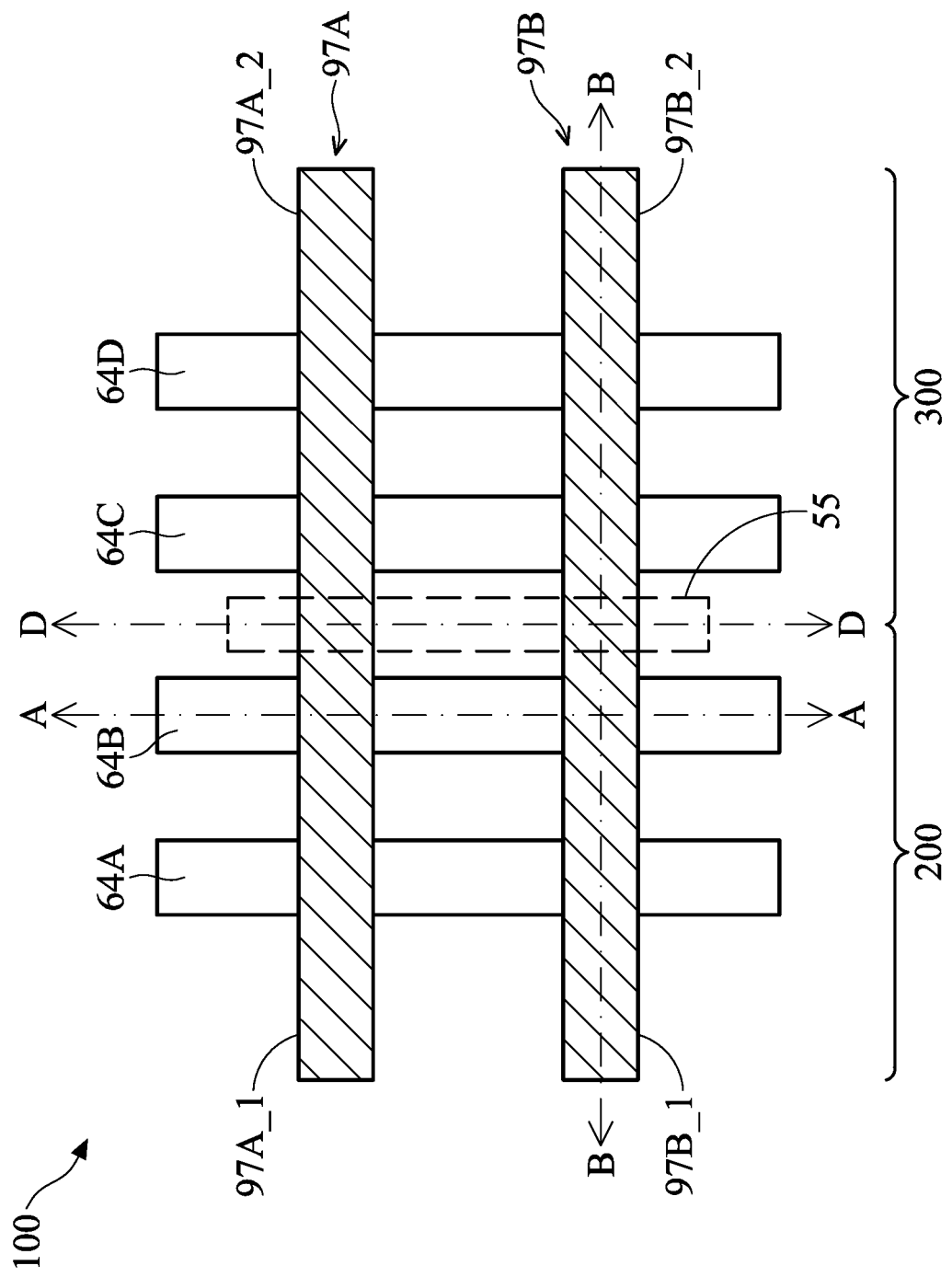
Figure 16A:
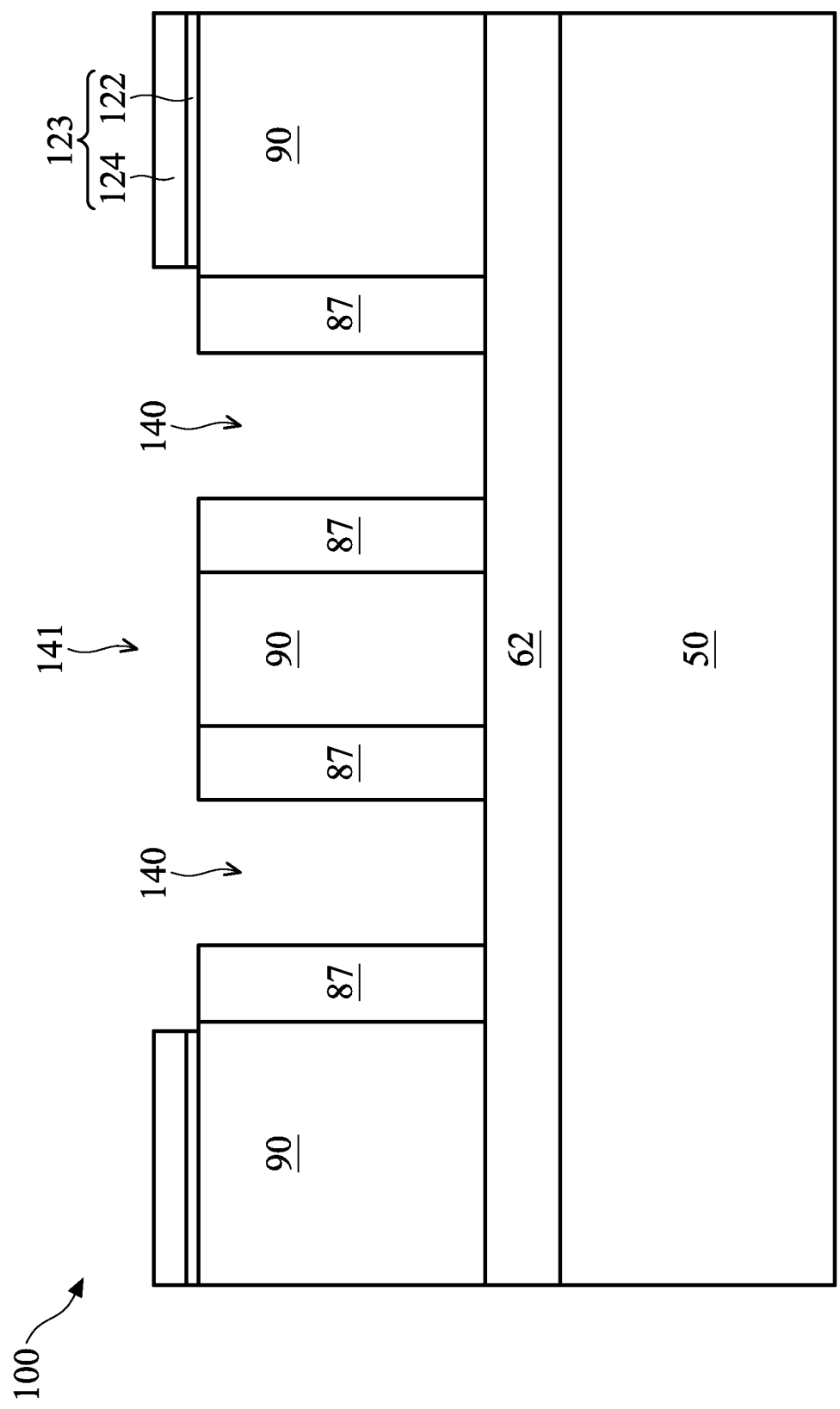
Figure 16B:
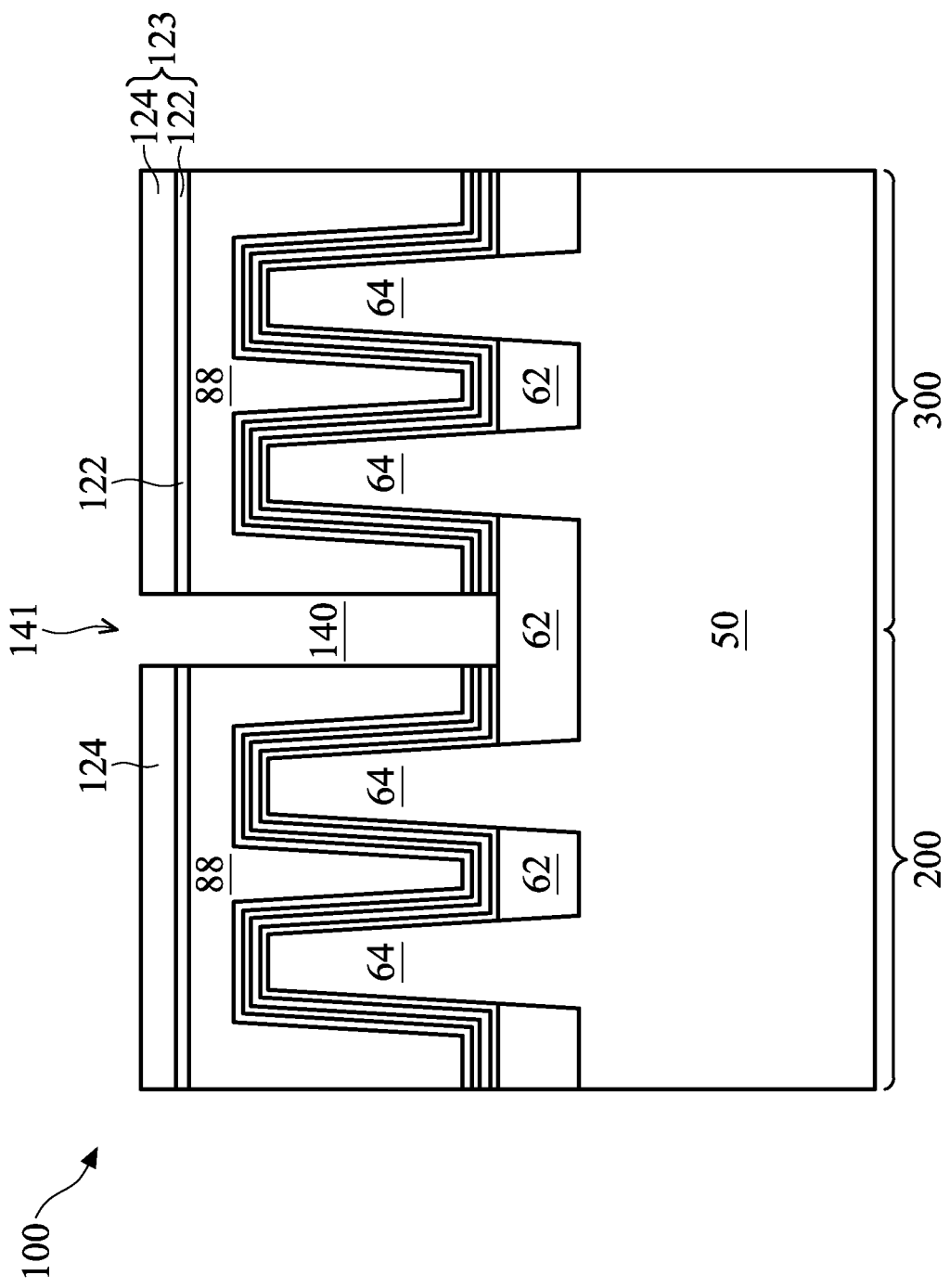
Figure 17A:
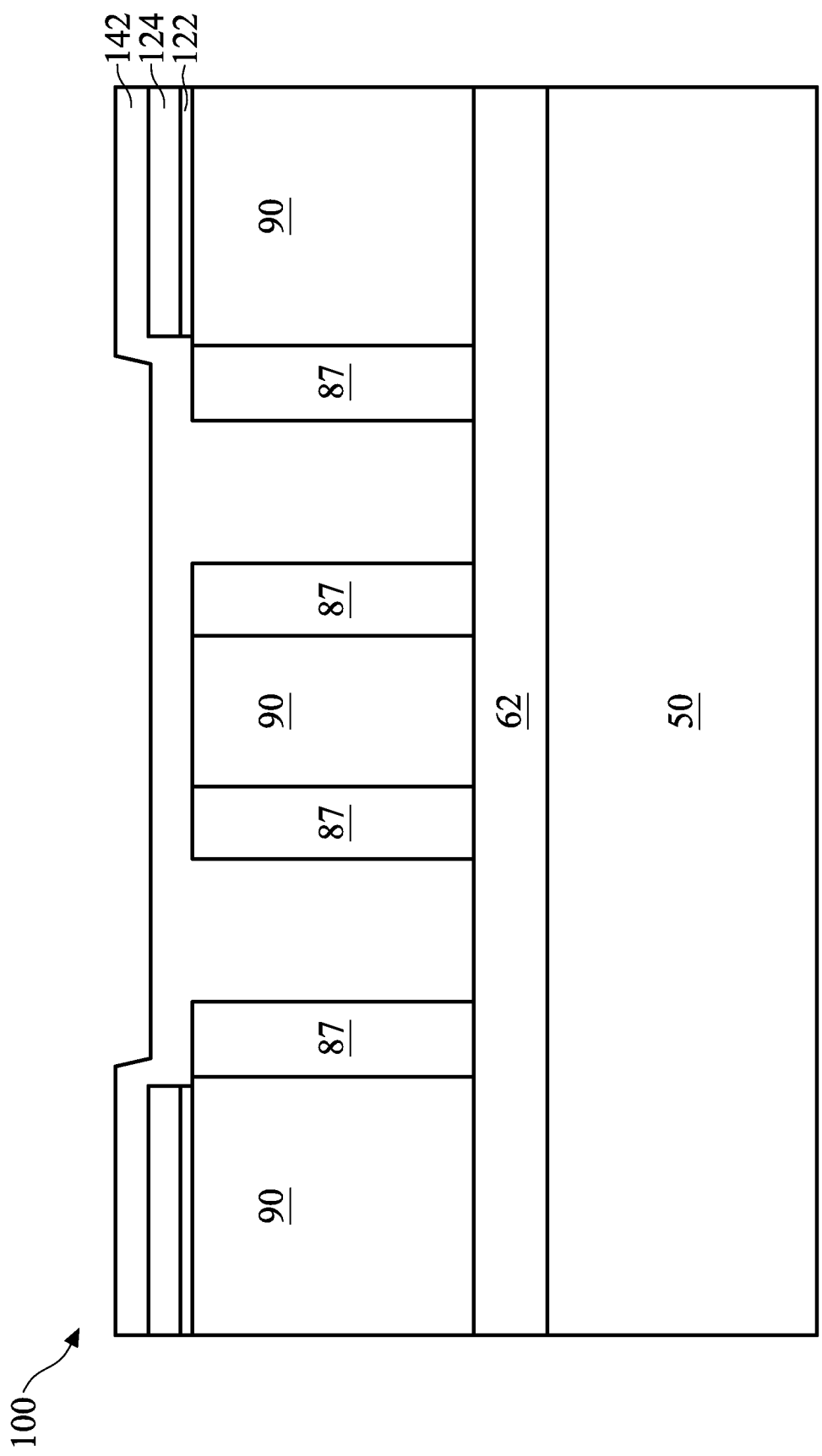
Figure 17B:
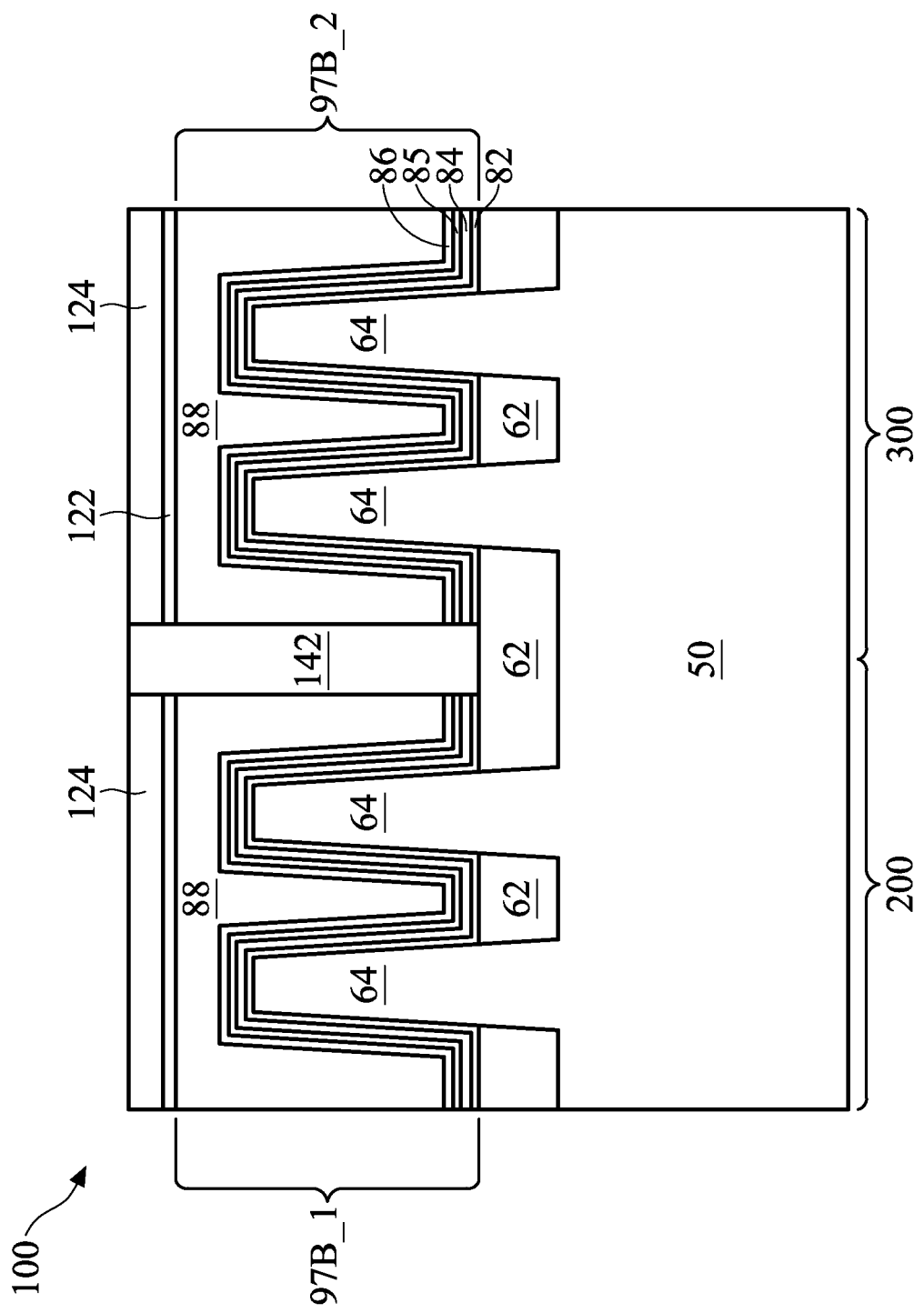
Figure 18A:
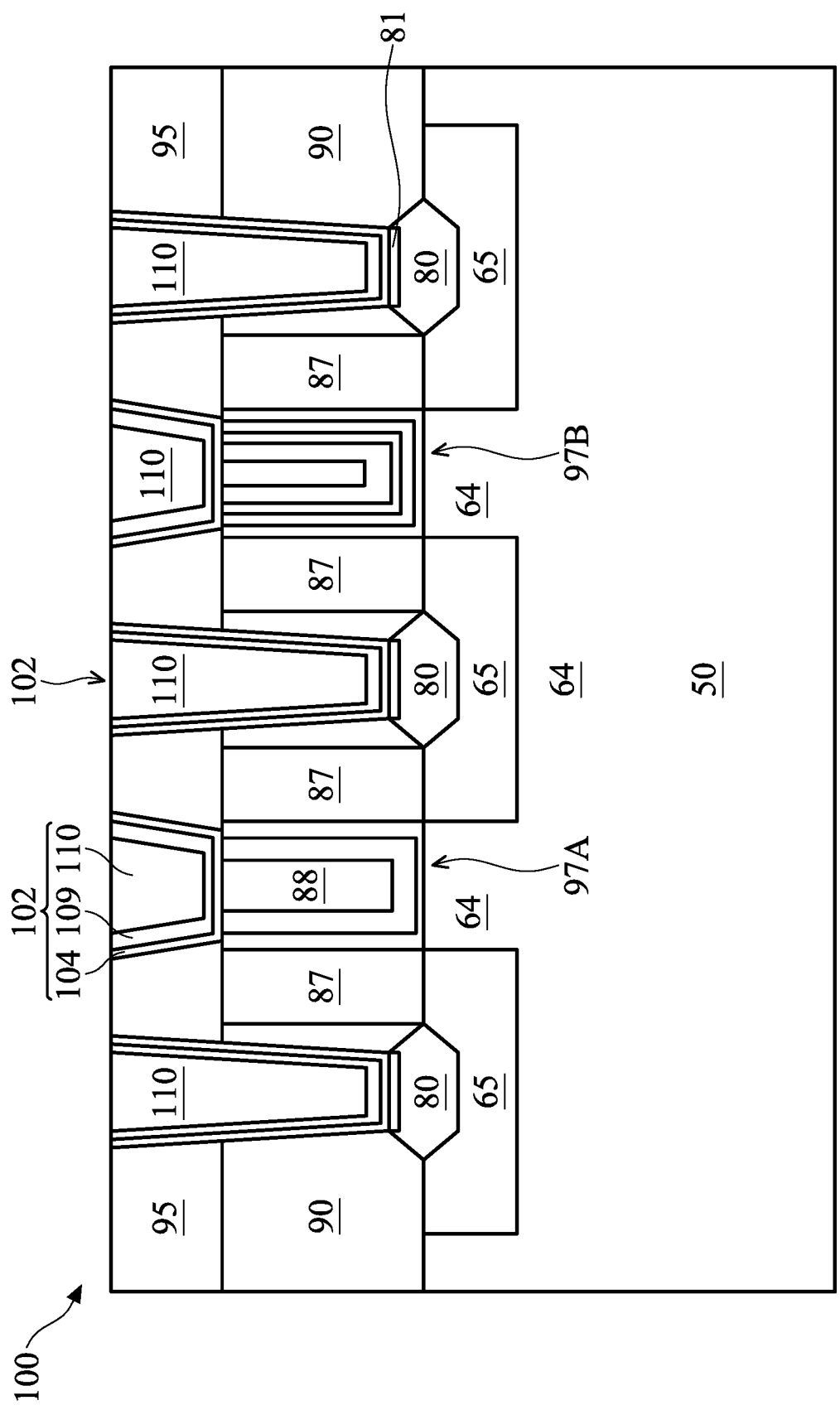
Figure 18B:
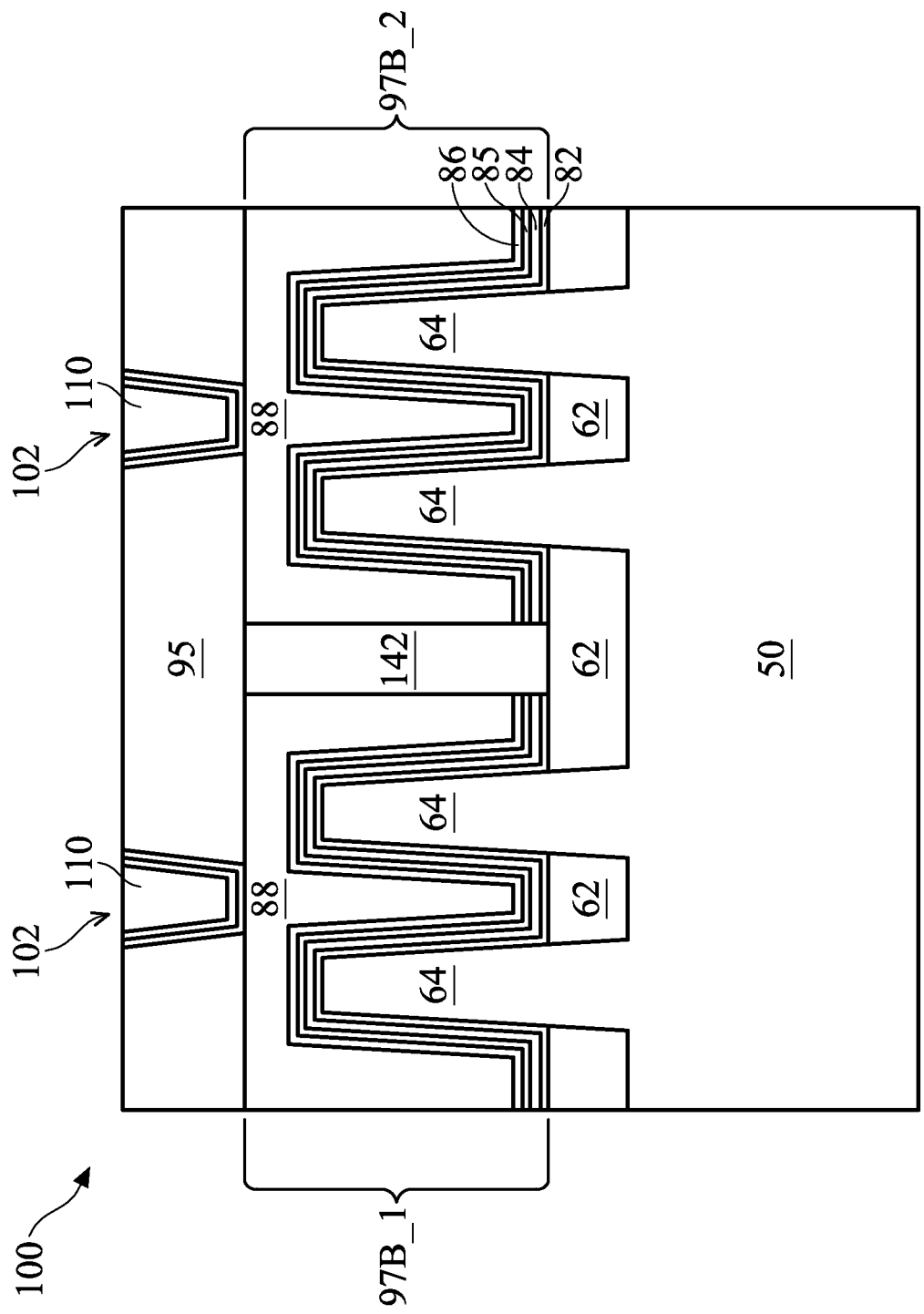

FIGS. 2-5, 6A-6C, 7-13, 14A, 14B, 15, 16A, 16B, 17A, 17B, 18A, and 18B illustrate various views (e.g., cross-sectional view, plan view) of a FinFET device 100 at various stages of fabrication in accordance with some embodiments. In the present disclosure, figures with the same numeral but different letters (e.g., 14A, 14B) refer to different views of the FinFET device 100 at a same stage of processing. The FinFET device 100 is similar to the FinFET 30 in FIG. 1, except for multiple fins and multiple gate structures. FIGS. 2-5 illustrate cross-sectional views of the FinFET device 100 along cross-section B-B, and FIGS. 6A, 7-13, and 14A illustrate cross-sectional views of the FinFET device 100 along cross-section A-A. FIGS. 6B and 6C illustrate various embodiment cross-sectional views of the FinFET device 100 along cross-section C-C. FIG. 14B illustrates the cross-sectional view of the FinFET device 100 along cross-section D-D. FIG. 15 is a plan view of the FinFET device 100. FIGS. 16A and 17A illustrate cross-sectional views of the FinFET device 100 along cross-section D-D, and FIGS. 16B and 17B illustrate cross-sectional views of the FinFET device 100 along cross-section B-B. FIGS. 18A and 18B illustrate cross-sectional views of the FinFET device 100 along cross-sections A-A and B-B, respectively.

Figure 2:
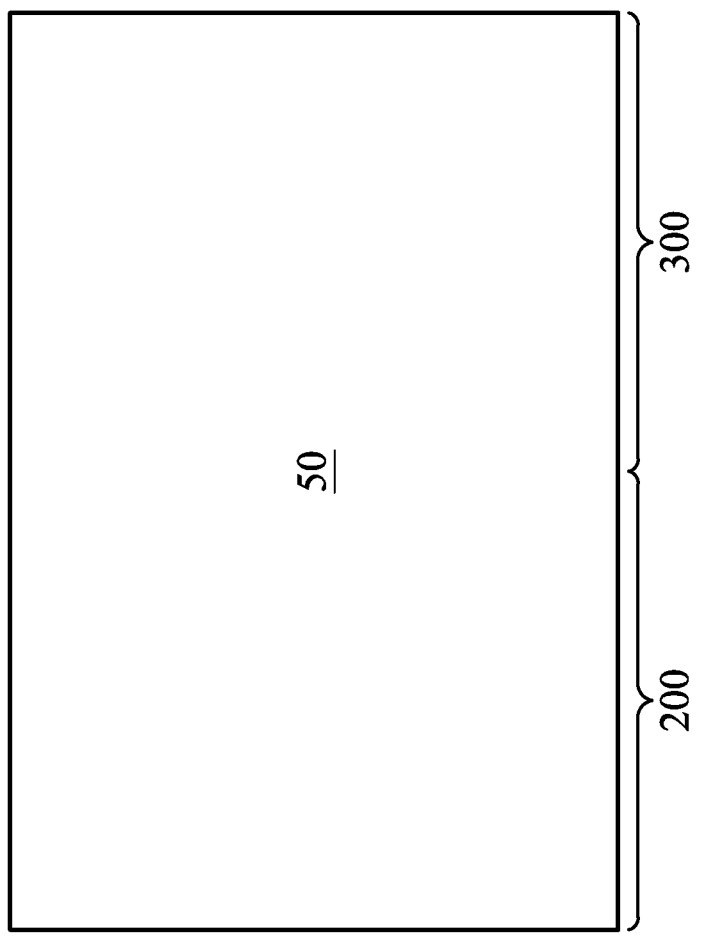
FIGS. 2-5, 6A-6C, 7-13, 14A, 14B, 15, 16A, 16B, 17A, 17B, 18A, and 18B illustrate various views (e.g., cross-sectional view, plan view) of a FinFET device at various stages of fabrication, in accordance with some embodiments.

FIG. 2 illustrates a cross-sectional view of a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As illustrated in FIG. 2, the substrate 50 includes a region 200 and a region 300, which may be used to form different types (e.g., n-type and p-type) of semiconductor devices. For example, the region 200 may be used to form n-type transistors and may be referred to as an n-type device region (e.g., an NMOS region), and the region 300 may be used to form p-type transistors and may be referred to as a p-type device region (e.g., a PMOS region).

Figure 3:
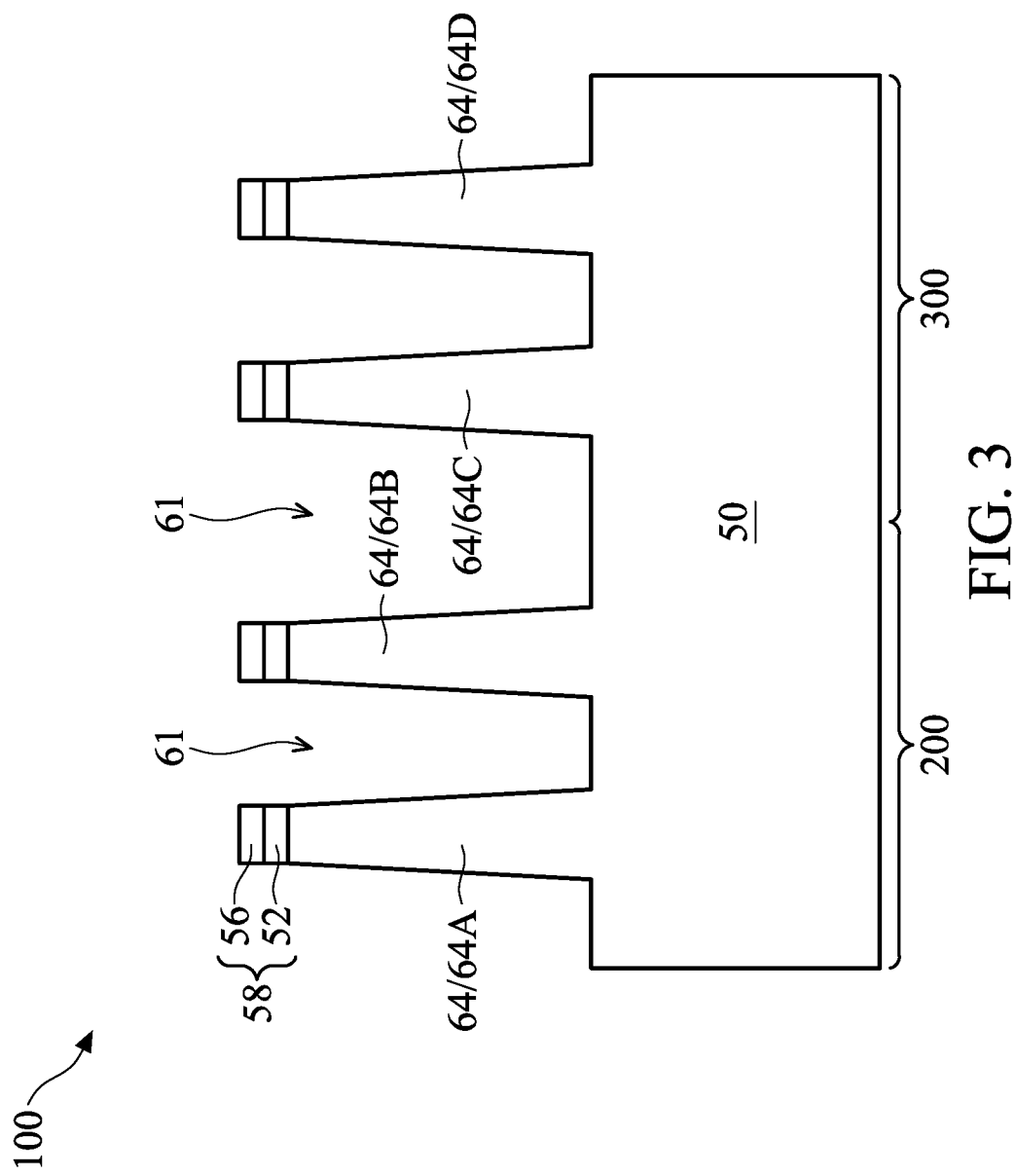

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56 and may act as an etch stop layer for etching the pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fin 64 (also referred to as fins) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etching process may be anisotropic. In some embodiments, the trenches 61 may be strips (viewed from in the top) parallel to each other, and closely spaced with respect to each other. In some embodiments, the trenches 61 may be continuous and surround the semiconductor fins 64. After semiconductor fins 64 are formed, the patterned mask 58 may be removed by etching or any suitable method.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in an embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 4:
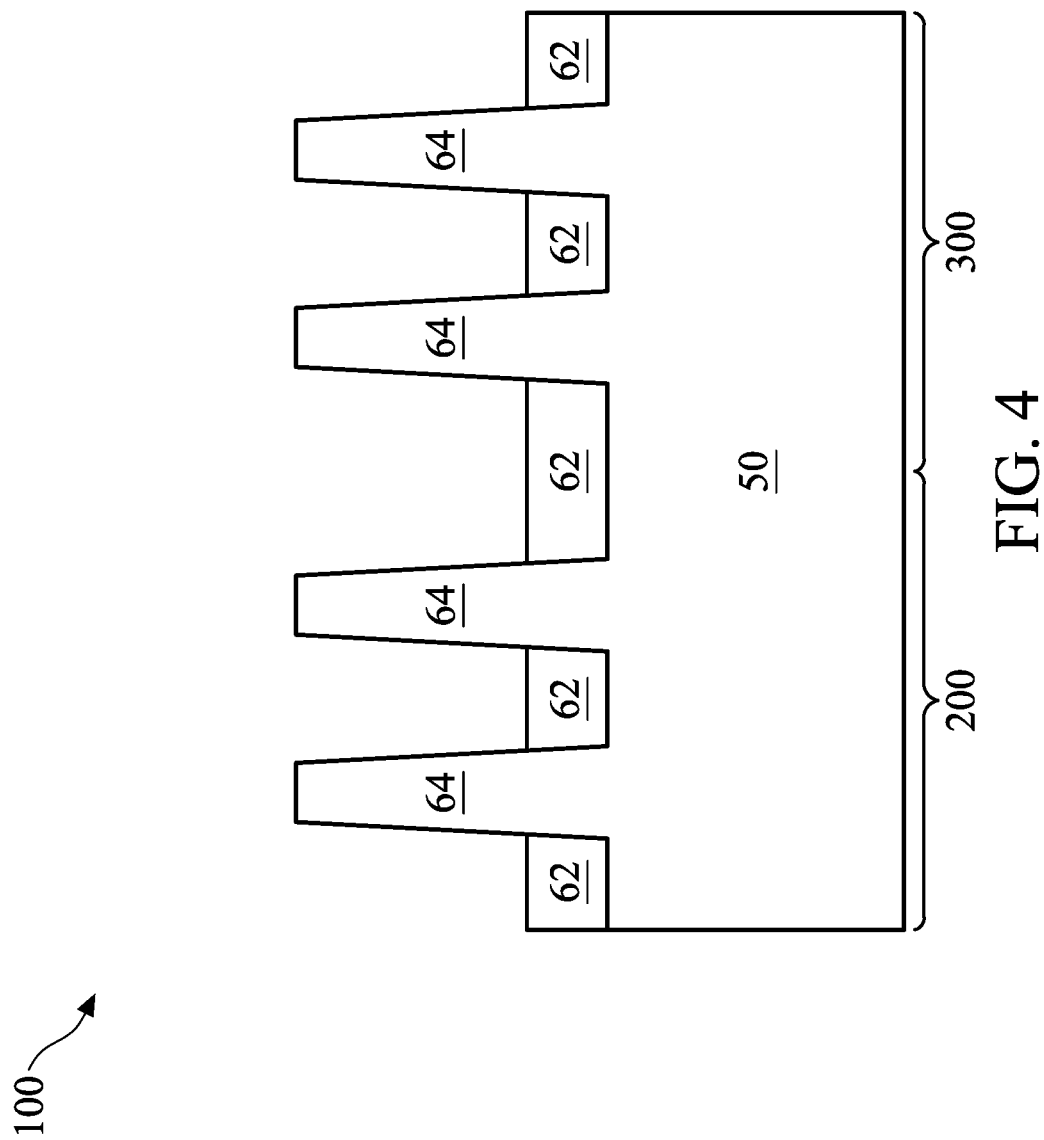

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material (and, if present, the patterned mask 58) and form top surfaces of the isolation regions 62 and top surfaces of the semiconductor fins 64 that are coplanar (not shown).

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions. The isolation regions 62 are recessed such that the upper portions of the semiconductor fins 64 protrude from between neighboring isolation regions 62. The top surfaces of the isolation regions 62 may have a flat surface (as illustrated), a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a wet etch process using dilute hydrofluoric (dHF) acid may be used.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor fins may be recessed, and a material different from the semiconductor fins may be epitaxially grown in their place.

In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
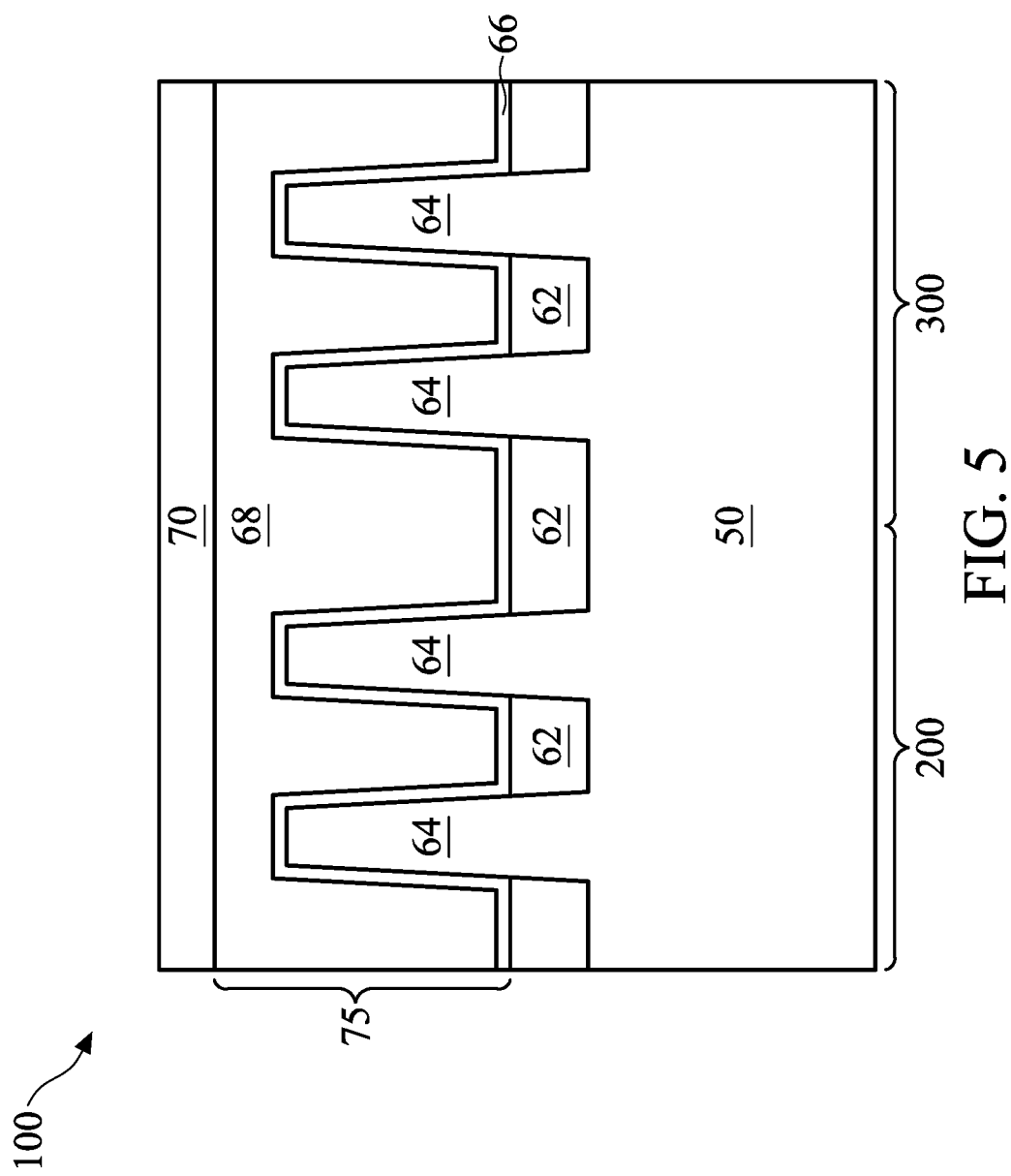

FIG. 5 illustrates the formation of a dummy gate structure 75 over the semiconductor fins 64. The dummy gate structure 75 includes gate dielectric 66 and gate 68, in some embodiments. The dummy gate structure 75 may be formed by patterning a mask layer, a gate layer and a gate dielectric layer, where the mask layer, the gate layer and the gate dielectric layer comprise a same material as the mask 70, the gate 68, and the gate dielectric 66, respectively. To form the dummy gate structure 75, the gate dielectric layer is formed on the semiconductor fins 64 and the isolation regions 62. The gate dielectric layer may be, for example, silicon oxide, silicon nitride, multilayers thereof, or the like, and may be deposited or thermally grown according to acceptable techniques.

The gate layer is formed over the gate dielectric layer, and the mask layer is formed over the gate layer. The gate layer may be deposited over the gate dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

Figure 6A:
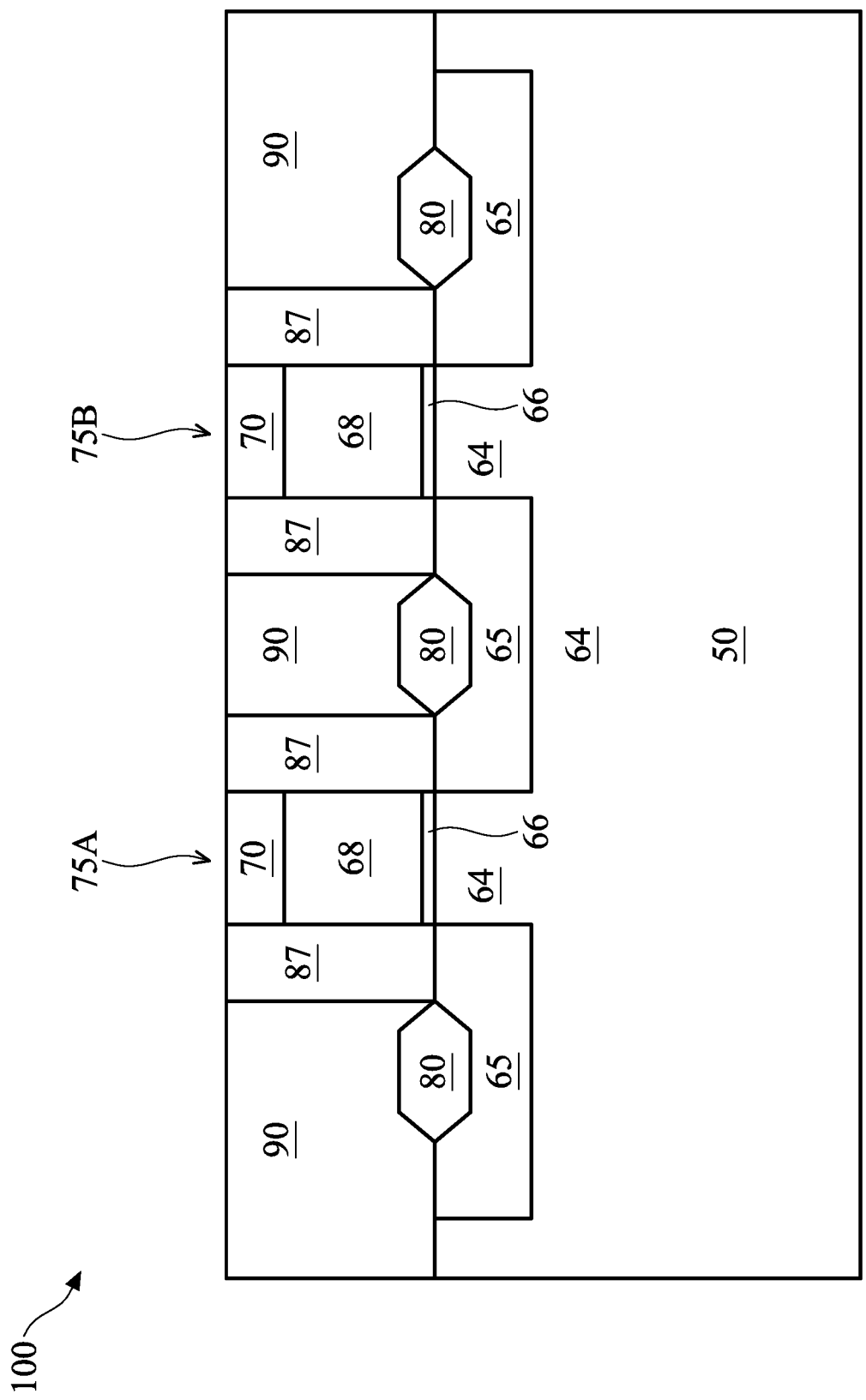
Figure 6B:
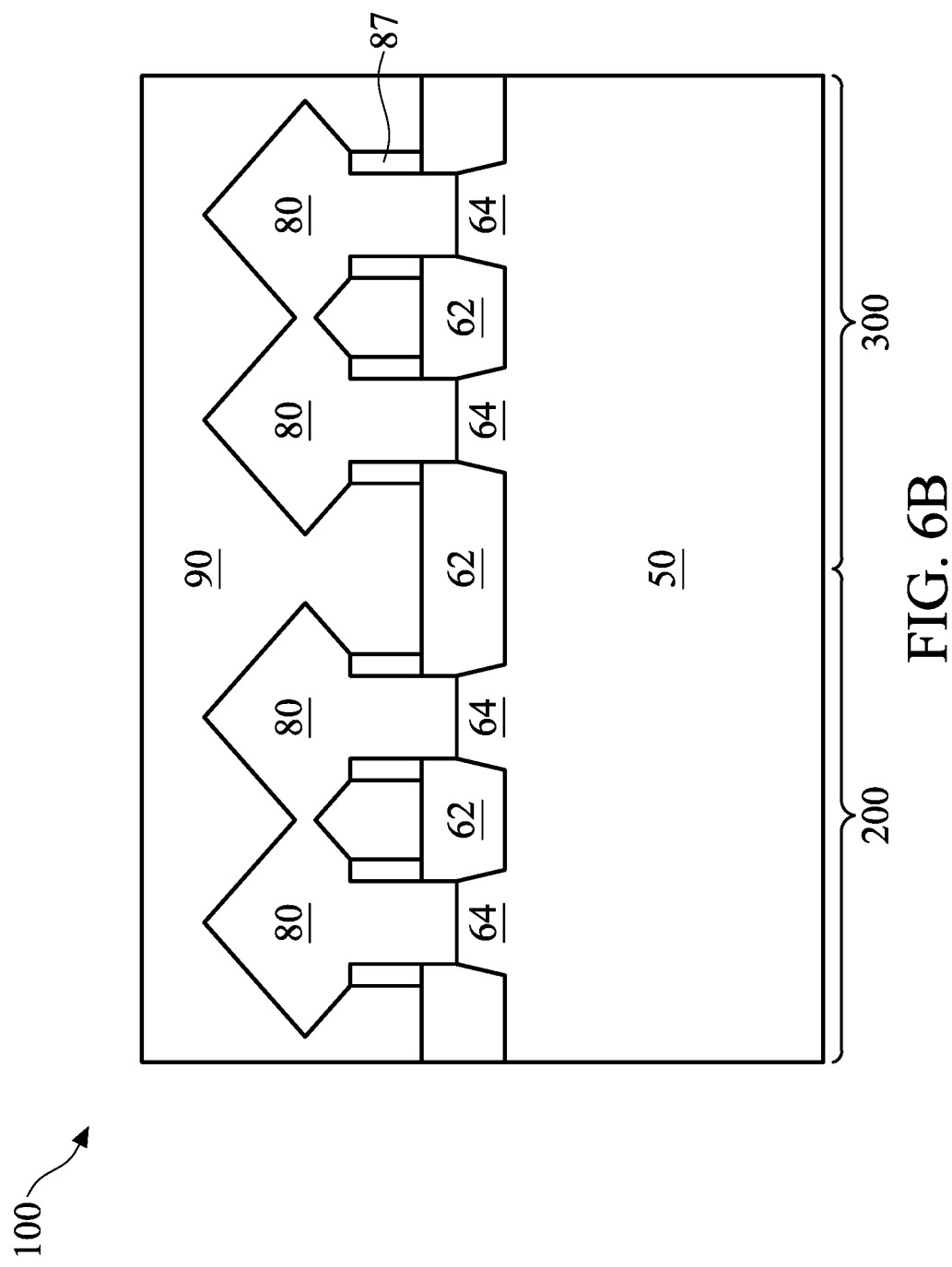
Figure 6C:
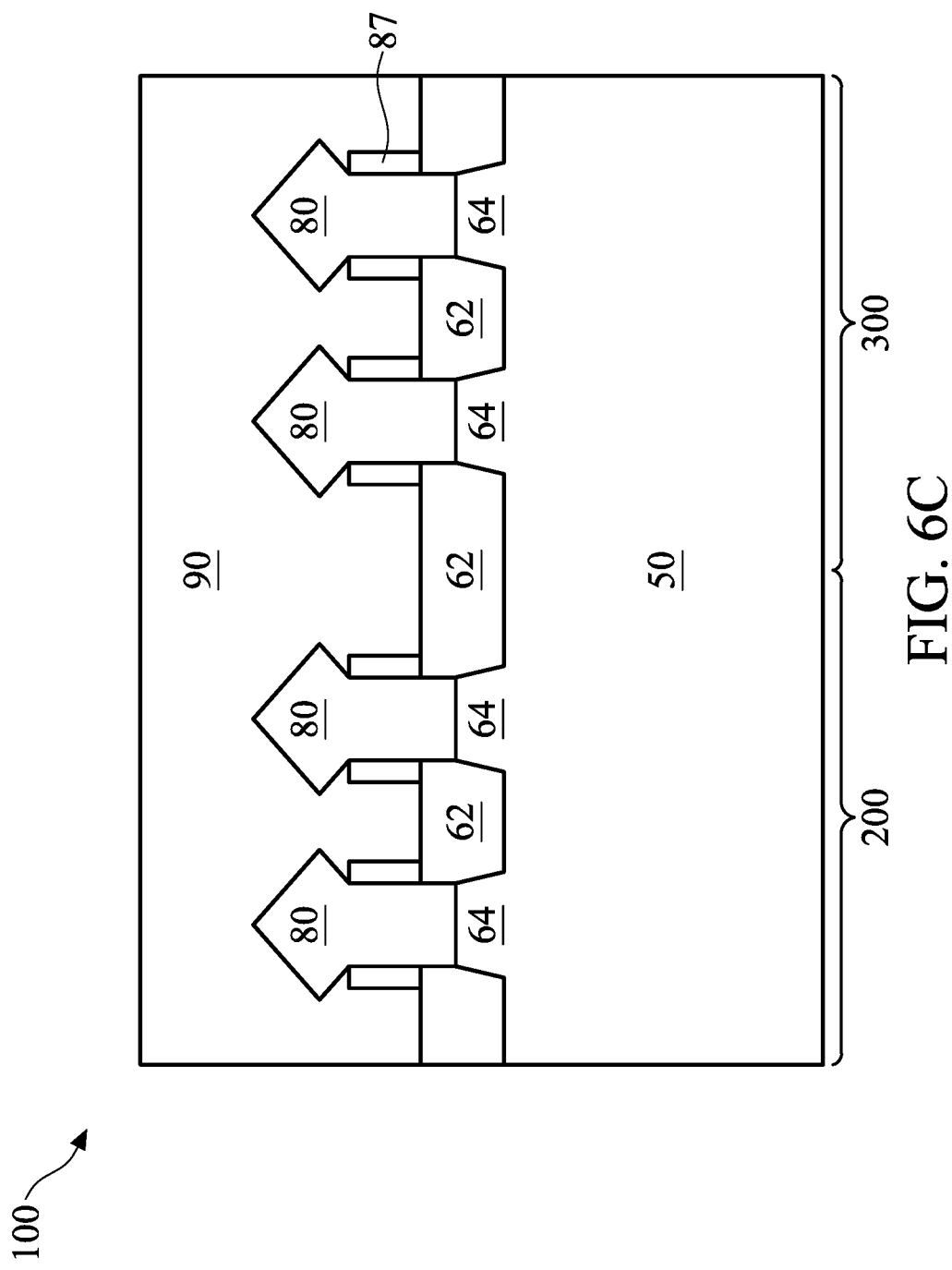

After the gate dielectric layer, the gate layer, and the mask layer are formed, the mask layer may be patterned using acceptable photolithography and etching techniques to form mask 70. The pattern of the mask 70 then may be transferred to the gate layer and the gate dielectric layer by a suitable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64. Although one dummy gate structure 75 is illustrated in the cross-sectional view of FIG. 5, more than one dummy gate structures 75 may be formed over the semiconductor fins 64. For example, two dummy gate structures 75 (e.g., 75A and 75B) are illustrated in FIG. 6A. The number of dummy gate structures illustrated herein is illustrative and non-limiting, other numbers of dummy gate structures are also possible and are fully intended to be included within the scope of the present disclosure.

FIG. 6A illustrates the cross-section views of further processing of the FinFET device 100 along cross-section A-A (along a longitudinal axis of the fin). As illustrated in FIG. 6A, lightly doped drain (LDD) regions 65 are formed in the fin 64. The LDD regions 65 may be formed by an implantation process. The implantation process may implant n-type or p-type impurities in the fins 64 to form the LDD regions 65. In some embodiments, the LDD regions 65 abut the channel region of the FinFET device 100. Portions of the LDD regions 65 may extend under gate 68 and into the channel region of the FinFET device 100. FIG. 6A illustrates a non-limiting example of the LDD regions 65. Other configurations, shapes, and formation methods of the LDD regions 65 are also possible and are fully intended to be included within the scope of the present disclosure. For example, LDD regions 65 may be formed after gate spacers 87 are formed.

Still referring to FIG. 6A, after the LDD regions 65 are formed, gate spacers 87 are formed on the gate structure. In the example of FIG. 6A, the gate spacers 87 are formed on opposing sidewalls of the gate 68 and on opposing sidewalls of the gate dielectric 66. The gate spacers 87 may be formed of a nitride, such as silicon nitride, silicon oxynitride, silicon carbide, silicon carbonitride, the like, or a combination thereof, and may be formed using, e.g., a thermal oxidation, CVD, or other suitable deposition process. The gate spacers 87 may also extend over the upper surface of the semiconductor fins 64 and the upper surface of the isolation region 62.

The shapes and formation methods of the gate spacers 87 as illustrated in FIG. 6A are merely non-limiting examples, and other shapes and formation methods are possible. For example, the gate spacers 87 may include first gate spacers (not shown) and second gate spacers (not shown). The first gate spacers may be formed on the opposing sidewalls of the dummy gate structure 75. The second gate spacers may be formed on the first gate spacers, with the first gate spacers disposed between a respective gate structure and the respective second gate spacers. The first gate spacers may have an L-shape in a cross-sectional view. As another example, the gate spacers 87 may be formed after the epitaxial source/drain regions 80 are formed. In some embodiments, dummy gate spacers are formed on the first gate spacers (not shown) before the epitaxial process of the epitaxial source/drain regions 80, and the dummy gate spacers are removed and replaced with the second gate spacers after the epitaxial source/drain regions 80 are formed. All such embodiments are fully intended to be included in the scope of the present disclosure.

Next, as illustrated in FIG. 6A, source/drain regions 80 are formed. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 6A, the epitaxial source/drain regions 80 may have surfaces raised from respective surfaces of the fins 64 (e.g. raised above the non-recessed portions of the fins 64) and may have facets. The source/drain regions 80 of the adjacent fins 64 (e.g., fins 64 in the regions 200 or in the regions 300 in FIG. 6B) may merge to form a continuous epitaxial source/drain region 80, as illustrated in FIG. 6B. In some embodiments, the source/drain regions 80 of adjacent fins 64 do not merge together and remain as separate source/drain regions 80, as illustrated in FIG. 6C. In some embodiments, source/drain regions 80 in n-type device regions (e.g., region 200) comprise silicon carbide (SiC), silicon phosphorous (SiP), phosphorous-doped silicon carbon (SiCP), or the like. In some embodiments, source/drain regions 80 in p-type device regions (e.g., region 300) comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET that are to be protected from the implanting process. For example, a patterned mask layer may be formed to expose the region 200 and to shield the region 300 from the implanting process for the region 200, and another pattered mask layer may be formed to expose the region 300 and to shield the region 200 from the implanting process for the region 300. The source/drain regions 80 may have an impurity (e.g., dopant) concentration in a range from about 1E19 $cm^{-3}$ to about 1E21 $cm^{-3}$. In some embodiments, the epitaxial source/drain regions may be in situ doped during growth.

Next, as illustrated in FIG. 6A, a first interlayer dielectric (ILD) 90 is formed over the dummy gate structures 75, the gate spacers 87, and the source/drain region 80. In some embodiments, the first ILD 90 is formed of a dielectric material such as silicon oxide (SiO), phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to planarize the top surface of the first ILD 90, such that the top surface of the first ILD 90 is level with the top surface of the gate 68 after the CMP process (not shown). Therefore, after the CMP process, the top surface of the gate 68 is exposed, in some embodiments.

Next, as illustrated in FIGS. 7-13, 14A and 14B, a gate-last process (sometimes referred to as replacement gate process) is performed to replace the dummy gate structures 75 with replacement gates. In a gate-last process, the gate 68 and the gate dielectric 66 (see FIG. 5) are considered dummy gate and dummy gate dielectric, respectively, and are removed and replaced with an active gate and active gate dielectric, which may be collectively referred to as a replacement gate. The replacement gate may also be referred to as a metal gate, or a metal gate structure.

In FIGS. 7-13, 14A and 14B, portions of the dummy gate structures 75 in the region 200 (see FIG. 15) are replaced by metal gates (e.g., 97A_1, 97B_1) in a first replacement gate process while the region 300 is shielded from the first replacement process by a first mask layer (e.g., a patterned photoresist, not shown). In other words, portions of the dummy gate structure 75 in the region 300 are not removed by the first replacement gate process. After the first replacement gate process, the first mask layer is removed, and a second replacement gate process, which is same as or similar to the first replacement gate process, is performed to replace the portions of the dummy gate structures 75 in the region 300 with metal gates (e.g., 97A_2, 97B_2) while the region 200 is shield by a second mask layer (e.g., a patterned photoresist, not shown) from the second replacement gate process. The second mask layer may then be removed after the second replacement gate process.

FIGS. 7-13, 14A and 14B illustrates processing of the first replacement gate process discussed above to replace portions of the dummy gate structures 75 in the region 200 with metal gates. One of ordinary skill, upon reading the present disclosure, will readily understand the processing for the second replacement gate process discussed above, thus details are not repeated. Therefore, only the first replacement gate process is discussed in this disclosure with reference to FIGS. 7-13, 14A and 14B.

FIGS. 7-13, 14A and 14B illustrate cross-section views of the FinFET device 100 along cross-section A-A of the fin 64B (see FIG. 15) in the region 200 (e.g., an n-type device region). Therefore, in the discussion below with reference to FIGS. 7-13, 14A and 14B, the dummy gate structure 75 (e.g., 75A, 75B) and the metal gate structure 97 (e.g., 97A, 97B) refer to portions of the respective structures (e.g., dummy gate structure 75 and metal gate structure 97) in the region 200.

Figure 7:
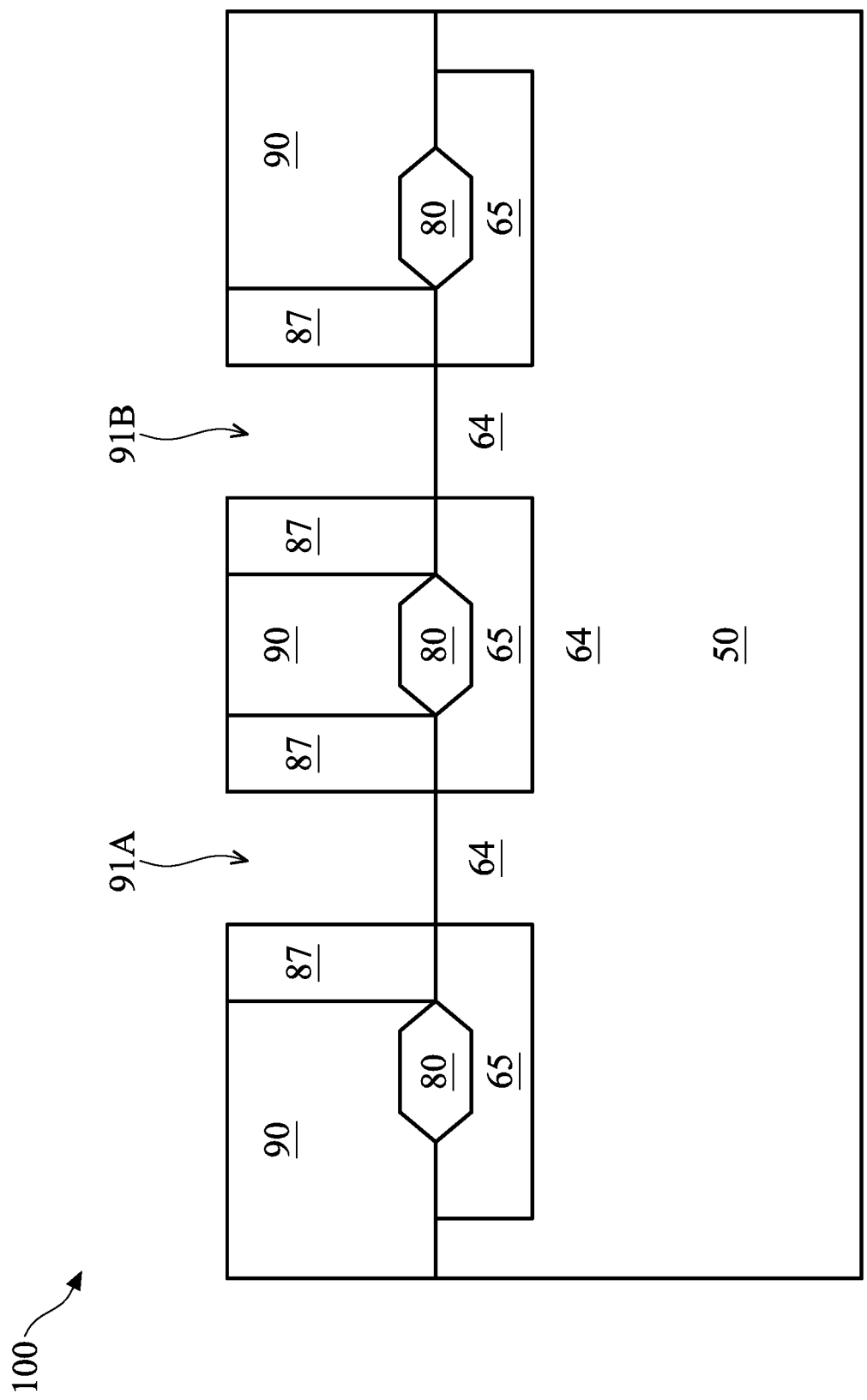

Referring now to FIG. 7, the dummy gate structures 75 (see FIG. 6A) are removed to form recesses 91 (e.g., 91A and 91B) in the first ILD 90. In accordance with some embodiments, the gate 68 and the gate dielectric 66 directly under the gate 68 are removed in an etching step(s), so that recesses 91 are formed. Each recess 91 exposes a channel region of a respective fin 64. Each channel region may be disposed between neighboring pairs of epitaxial source/drain regions 80. During the dummy gate removal, the gate dielectric 66 may be used as an etch stop layer when the gate 68 is etched. The gate dielectric 66 may then be removed after the removal of the gate 68.

Figure 8:
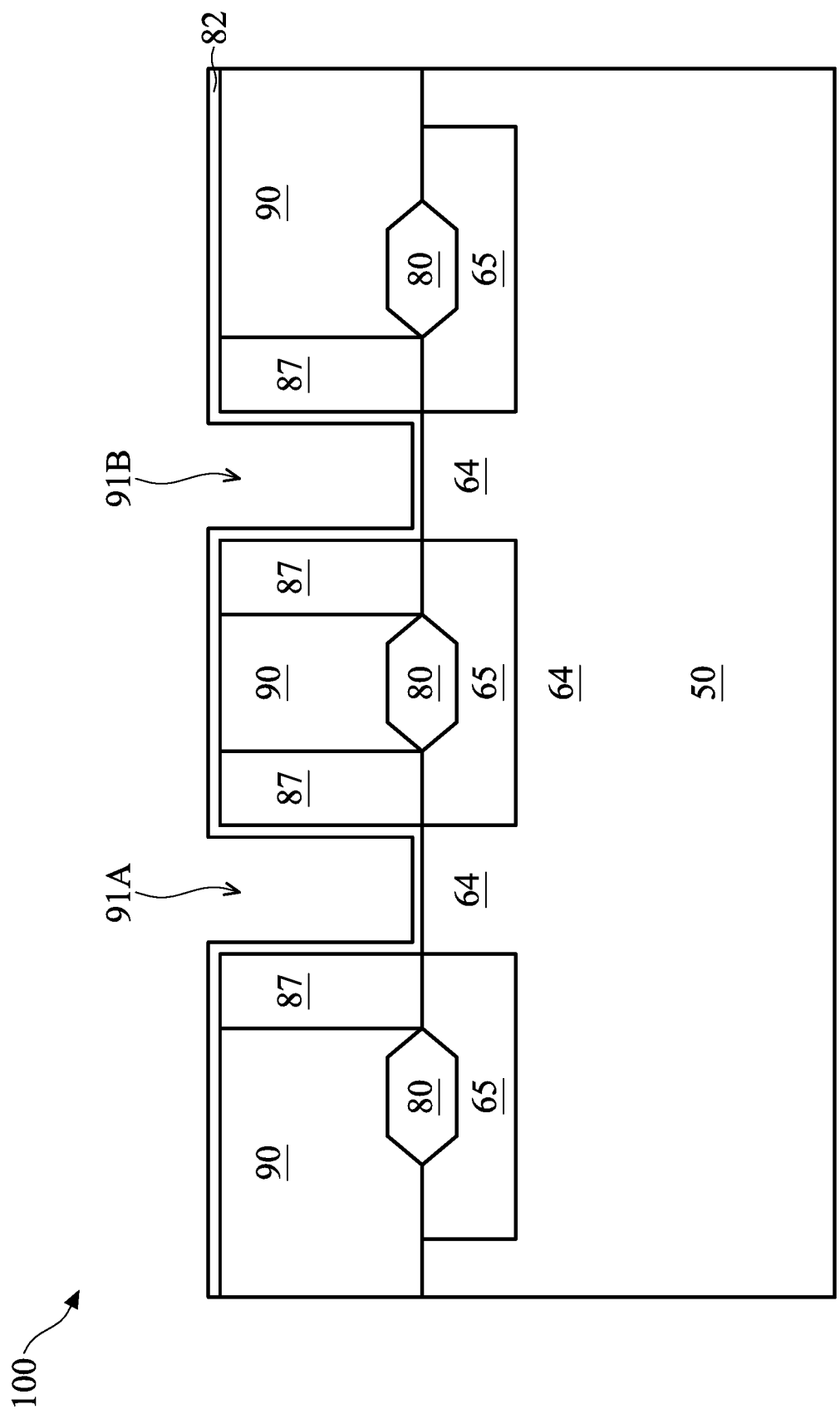

Next, in FIG. 8, a gate dielectric layer 82 is formed (e.g., conformally) in the recesses 91 and over the first ILD 90. As illustrated in FIG. 8, the gate dielectric layer 82 lines sidewalls and bottoms of the recesses 91, and extends along upper surfaces of the gate spacers 87 and along the upper surface of the first ILD 90. In accordance with some embodiments, the gate dielectric layer 82 comprises silicon oxide, silicon nitride, or multilayers thereof. In the illustrated embodiment, the gate dielectric layer 82 includes a high-k dielectric material, which may have a k value greater than about 7.0, and may include a metal oxide or a silicate of Hf, Al, Zr, La, Mg, Ba, Ti, Pb, and combinations thereof. The formation methods of gate dielectric layer 82 may include MBD, ALD, PECVD, and the like.

Figure 9:
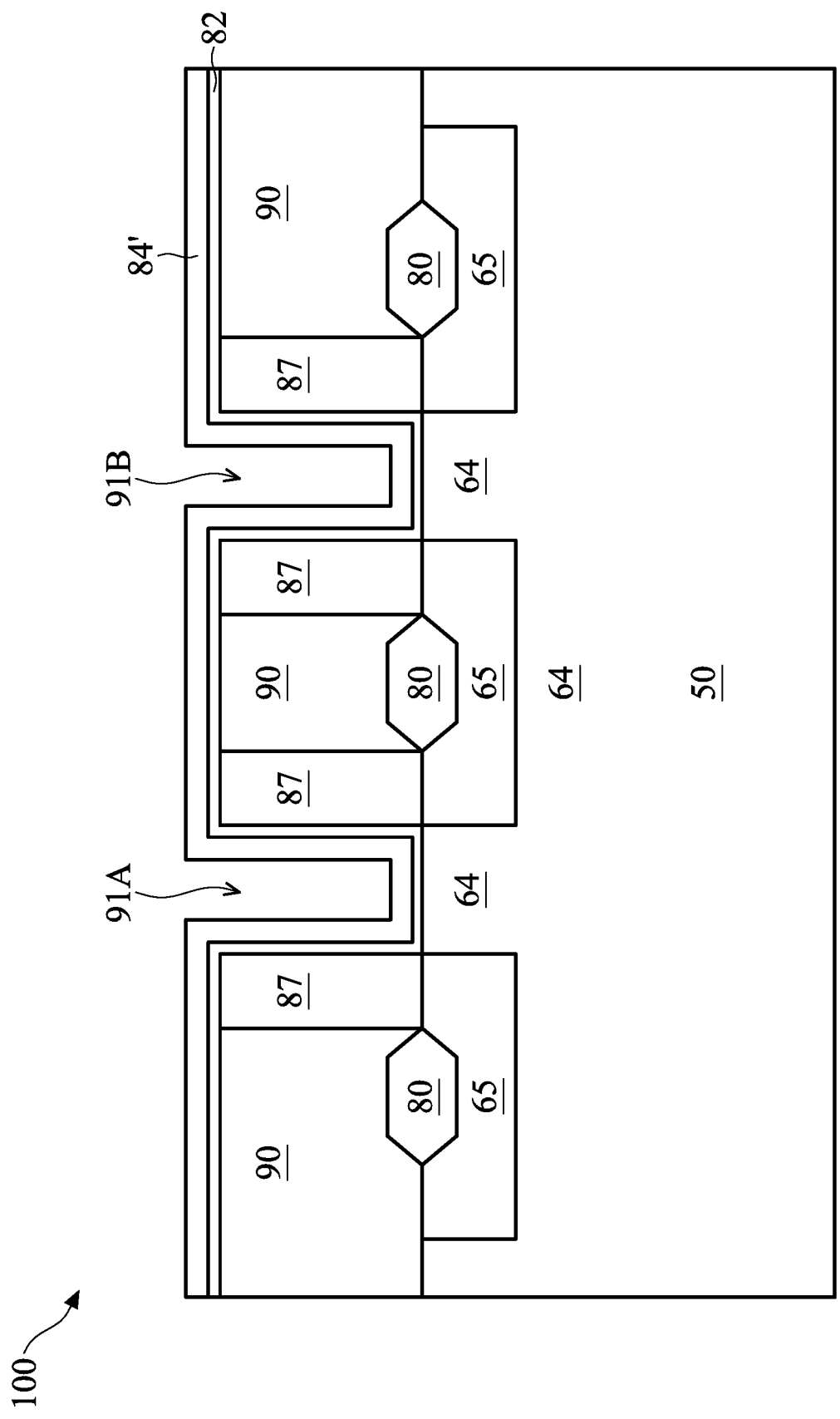

Next, in FIG. 9, a first work function layer 84' is formed (e.g., conformally) over the gate dielectric layer 82. In the illustrated embodiment, the first work function layer 84' is a p-type work function layer and comprises a p-type work function metal, such as titanium silicon nitride (e.g., TiSiN), formed by a suitable formation method such as ALD. Although TiSiN is used as an example, other suitable p-type work function metals, such as TiN, TaN, Ru, Mo, Al, WN, ZrSi2, MoSi2, TaSi2, NiSi2, WN, or combinations thereof, may also be used as the material of the first work function layer 84'.

Figure 10:
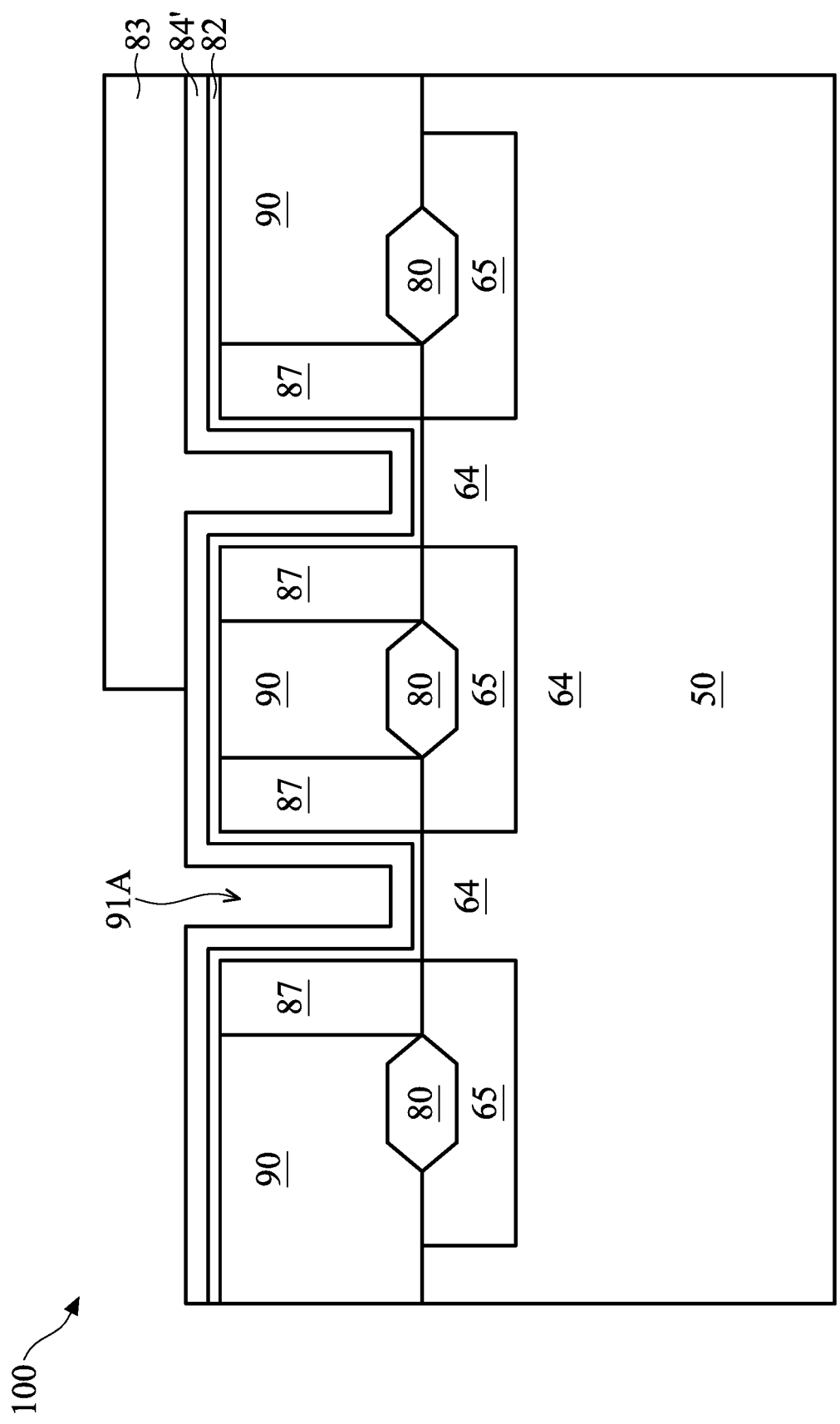

Next, in FIG. 10, a patterned mask layer 83 is formed over the first work function layer 84'. The patterned mask layer 83 fills the recess 91B (see FIG. 9), and extends over (e.g., covers) the upper surface of the first work function layer 84' proximate to the recess 91B. As illustrated in FIG. 10, the patterned mask layer 83 does not fill the recess 91A, and exposes the upper surface of the first work function layer 84' proximate to the recess 91A.

In an embodiment, to form the patterned mask layer 83, a bottom anti-reflective coating (BARC) layer and a photoresist are blanket deposited successively over the FinFET device 100 illustrated in FIG. 9. Next, the photoresist is patterned by exposing the photoresist to a patterned energy source and developing the photoresist using a developer. After developing the photoresist, a remaining portion of the photoresist has a shape corresponding to the shape of the patterned mask layer 83 to be formed. Next, the pattern of the patterned photoresist is transferred to the BARC layer using, e.g., an anisotropic etching process, and after the anisotropic etching process, a remaining portion of the BARC layer form the patterned mask layer 83. The BARC layer may be formed of a suitable dielectric material, such as a polymer. In an example embodiment, a composition of the BARC layer includes oxygen, and therefore, the patterned mask layer 83 also includes oxygen. In some embodiments, the anisotropic etching process used to pattern the BARC layer is a dry etch process performed using an etching gas comprises nitrogen (e.g., $N_2$) and hydrogen (e.g., $H_2$).

Figure 11:
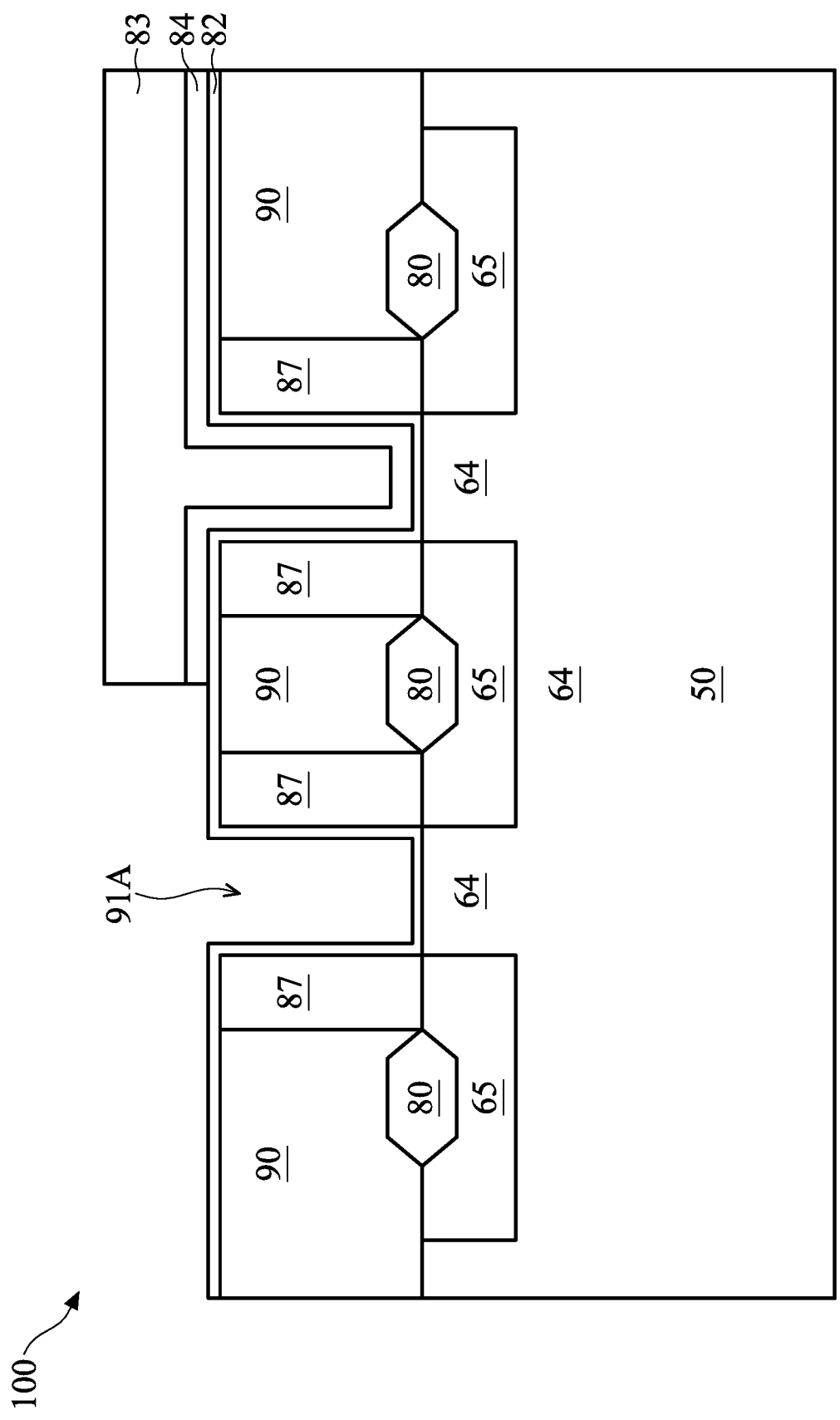

Next, in FIG. 11, exposed portions of the first work function layer 84', e.g., portions not covered by the patterned mask layer 83, are removed, and the remaining portions of the first work function layer 84' are denoted as first work function layer 84. In some embodiments, a wet etch process is performed to remove the exposed portions of the first work function layer 84', using an etchant that is selective to the material of the first work function layer 84'. In the illustrated embodiment, the first work function layer 84' comprises titanium silicon nitride, and the etchant used in the wet etch process comprises ammonia (e.g., $NH_3$). As illustrated in FIG. 11, the wet etch process removes the exposed portions of the first work function layer 84' and exposes the underlying gate dielectric layer 82.

Figure 12:
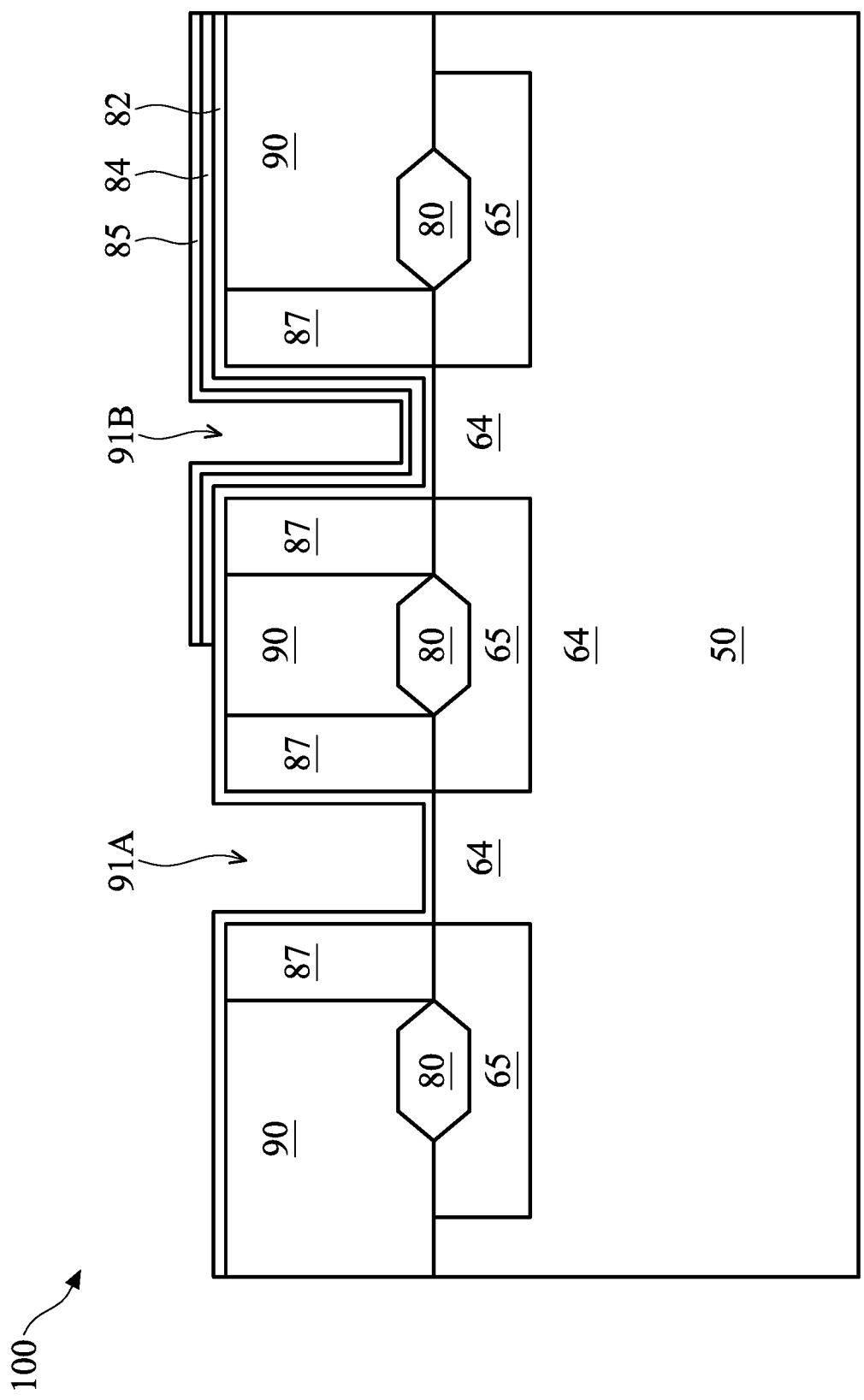

Next, in FIG. 12, the patterned mask layer 83 (e.g., a polymer layer comprising oxygen) is removed by a plasma process. In an embodiment, the plasma process is performed using a gas mixture of nitrogen (e.g., $N_2$), hydrogen (e.g., $H_2$) and helium (e.g., He). Note that in the illustrated embodiment, the gas mixture does not include oxygen. In some embodiments, when the gas mixture is activated into plasma, the H radicals from the hydrogen react with the patterned mask layer 83 to remove the pattern mask layer 83. The helium in the gas mixture may aid in the generation of the H radicals, and the nitrogen in the gas mixture may improve the etch rate of the plasma process.

In some embodiments, the plasma process is performed using the gas mixture of nitrogen, hydrogen and helium, and is performed at a temperature between about 240° C. and about 260° C., at a pressure between about 0.8 Torr and about 1.1 Torr. A flow rate of helium is between about 800 standard cubic centimeters per minute (sccm) and about 6000 sccm, a flow rate of hydrogen is between about 3000 sccm and about 5000 sccm, and a flow rate of nitrogen is between about 0 sccm and about 6000 sccm, in some embodiments.

In accordance with some embodiments, the patterned mask layer 83 is a polymer layer comprising oxygen, which oxygen is activated into active oxygen species during the plasma process. The oxygen species reacts with the first work function layer 84 and coverts a surface layer (e.g., an upper portion of 84 distal the substrate 50) of the first work function layer 84 into an oxide layer 85. In the illustrated example of FIG. 12, the first work function layer 84 comprises titanium silicon nitride, and the oxide layer 85 comprises silicon oxide.

Figure 13:
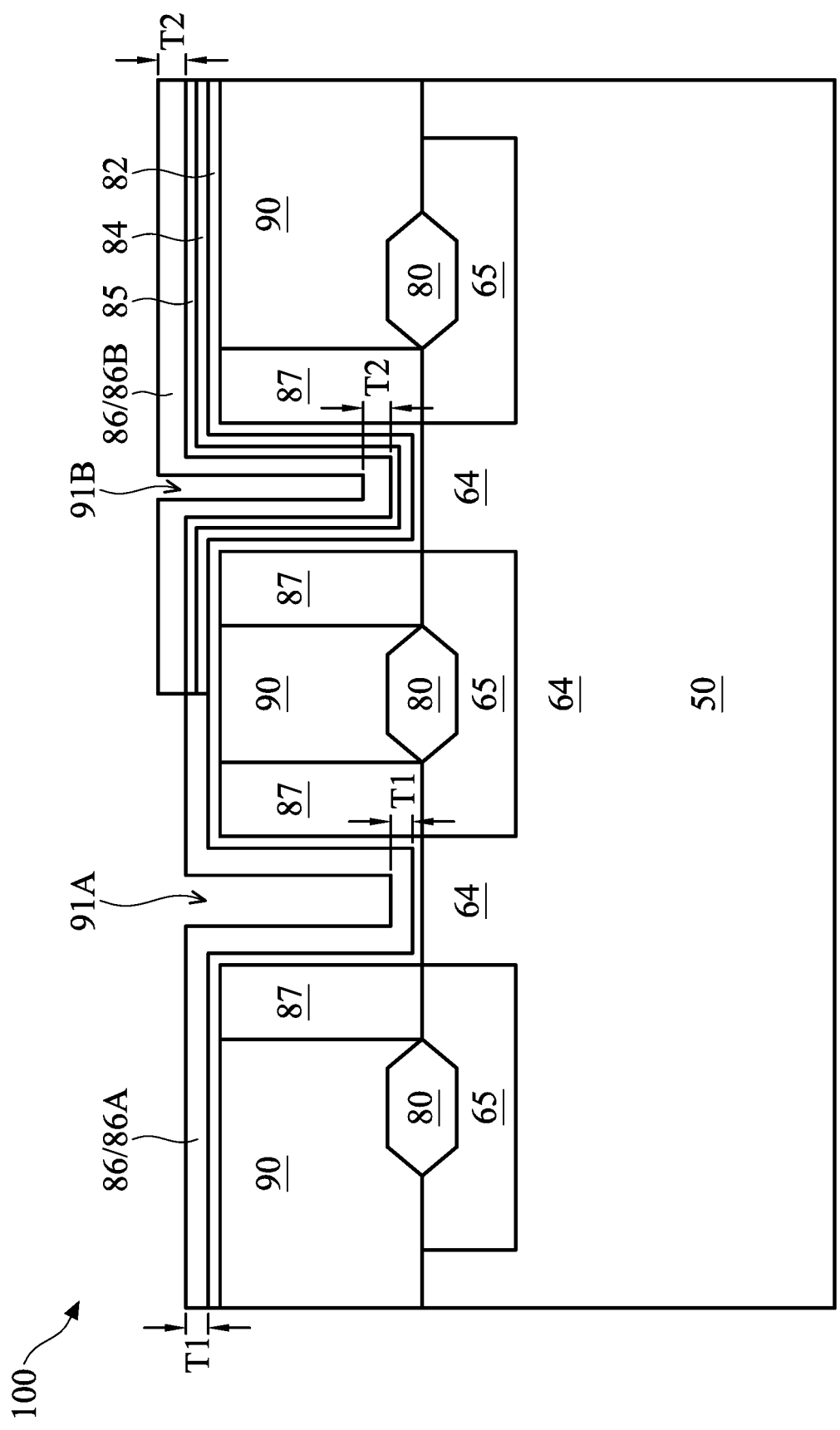

Next, in FIG. 13, a second work function layer 86 is formed (e.g., conformally) over the structure illustrated in FIG. 12. In particular, the second work function layer 86 includes a first portion 86A that lines sidewalls and the bottom of the recess 91A and extends along (e.g., physically contacts) the upper surface of the exposed portions of the gate dielectric layer 82. In addition, the second work function layer 86 also includes a second portion 86B that lines sidewalls and the bottom of the recess 91B and extends along (e.g., physically contacts) the upper surface of the oxide layer 85. The second work function layer 86 comprises an n-type work function metal such as aluminum-doped titanium carbide (e.g., TiAlC) formed by a suitable deposition method such as ALD, in an example embodiment. Although TiAlC is used an example of the second work function layer 86, other suitable n-type work function metals, such as TaAl, TaAlC, TiAlN, Mn, Zr, or combinations thereof, may also be used as the second work function layer 86.

As illustrated in FIG. 13, the first portion 86A and the second portion 86B of the second work function layer 86 have different thicknesses. In particular, the first portion 86A has a thickness T1 that is smaller than a thickness T2 of the second portion 86B. Without being limited to a particular theory, it is believed that the oxide layer 85 (e.g., silicon oxide) is hydrophobic, which is conducive to the formation of the second work function layer 86 (e.g., TiAlC). Therefore, although the same deposition process, e.g., an ALD process, is performed to form the second work function layer 86 over the gate dielectric layer 82 and over the oxide layer 85 at the same time, the second work function layer 86 is formed faster (e.g., having a higher deposition rate) over the oxide layer 85, in the illustrated embodiment. For example, after an ALD process with eight deposition cycles, the thickness T1 of the first portion 86A may be between about 10 angstroms and about 15 angstroms, and the thickness T2 of the second portion 86B may be larger than the thickness T1 by about 2 angstroms to about 3 angstroms.

In some embodiments, formation of the oxide layer 85 changes (e.g., increases) a diffusion rate of aluminum from the second work function layer 86 to the gate dielectric layer 82. For example, an intensity of aluminum in the gate dielectric layer 82, measured using X-ray fluorescence (XRF) technology, is larger than a base line value of 7.38 kilo counts per second (kcps), such as between about 7.57 kcps and about 7.84 kcps, where the base line value of 7.38 kcps corresponds to the intensity of aluminum in the gate dielectric layer 82 when the patterned mask layer 83 is not processed by the plasma process described above (e.g., the plasma process using a gas mixture comprising nitrogen).

In some embodiments, the flow rate of nitrogen in the plasma process performed to remove the patterned mask layer 83 is tuned (e.g., increased or decreased) to control the thickness T2 of the second portion 86B of the second work function layer 86. For example, increasing the flow rate of nitrogen in the plasma process may increase the thickness of the oxide layer 85, which in turn results in an increase in the thickness T2 of the second portion 86B formed over the oxide layer 85, and vice versa. In some embodiments, the duration of the plasma process is tuned (e.g., increased or decreased) to control the thickness T2 of the second portion 86B of the second work function layer 86. For example, the duration of the plasma process may be increased to increase the thickness of the oxide layer 85, which in turn results in an increase in the thickness T2 of the second portion 86B formed over the oxide layer 85, and vice versa. The thickness T1 of the first portion 86A of the second work function layer 86 is not affected by the flow rate of nitrogen or by the duration of the plasma process, in some embodiments.

By tuning the flow rate of nitrogen in the plasma process and/or the duration of the plasma process, the presently disclosed method allows the second work function layer 86 to be formed with different thicknesses (e.g., T1, T2) in different regions of the FinFET device 100 in a same deposition process (e.g., a same ALD process). To appreciate the advantage of the presently disclosed method, consider a reference method where different thicknesses of the second work function layer 86 are achieved by using different deposition processes. For example, the reference method may use two different ALD processes that have different numbers of deposition cycles to achieve different thicknesses. The two ALD processes may have to be performed in two separate processing steps, with a first ALD process (having a first number of deposition cycles) using a first patterned mask to cover a first region of the FinFET device 100 while the second work function layer 86 is being deposited in a second region, and with a second ALD process using a second patterned mask to cover the second region of the FinFET device 100 while the second work function layer 86 is being deposited in the first region. Therefore, the reference method needs more processing steps with different patterned masks, which increases the manufacturing time and cost. In contrast, the presently disclosed method saves processing time and cost by allowing the second work function layer 86 to be formed with different thicknesses in different regions in a single deposition processing (e.g., an ALD process).

Figure 14A:
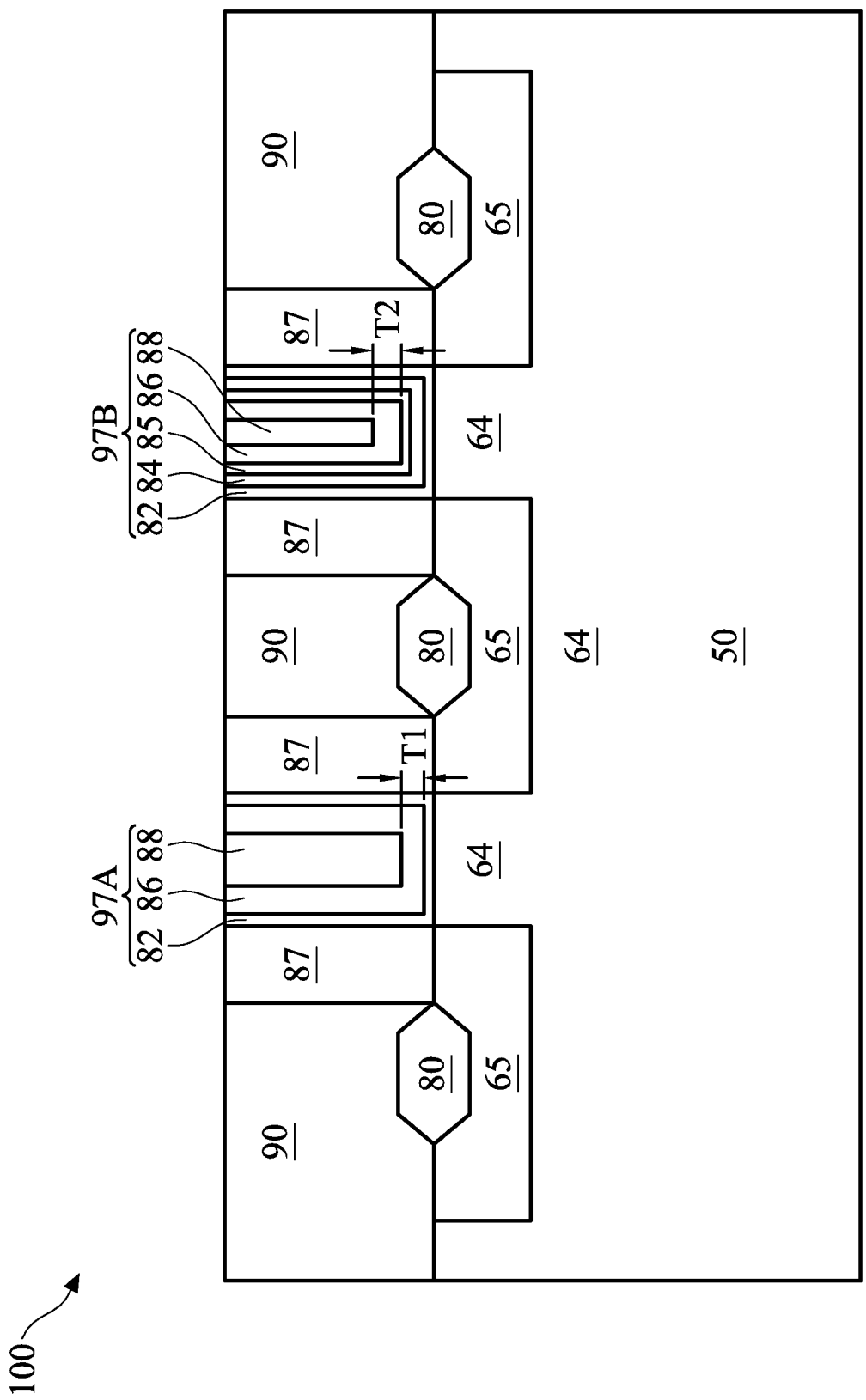
Figure 14B:
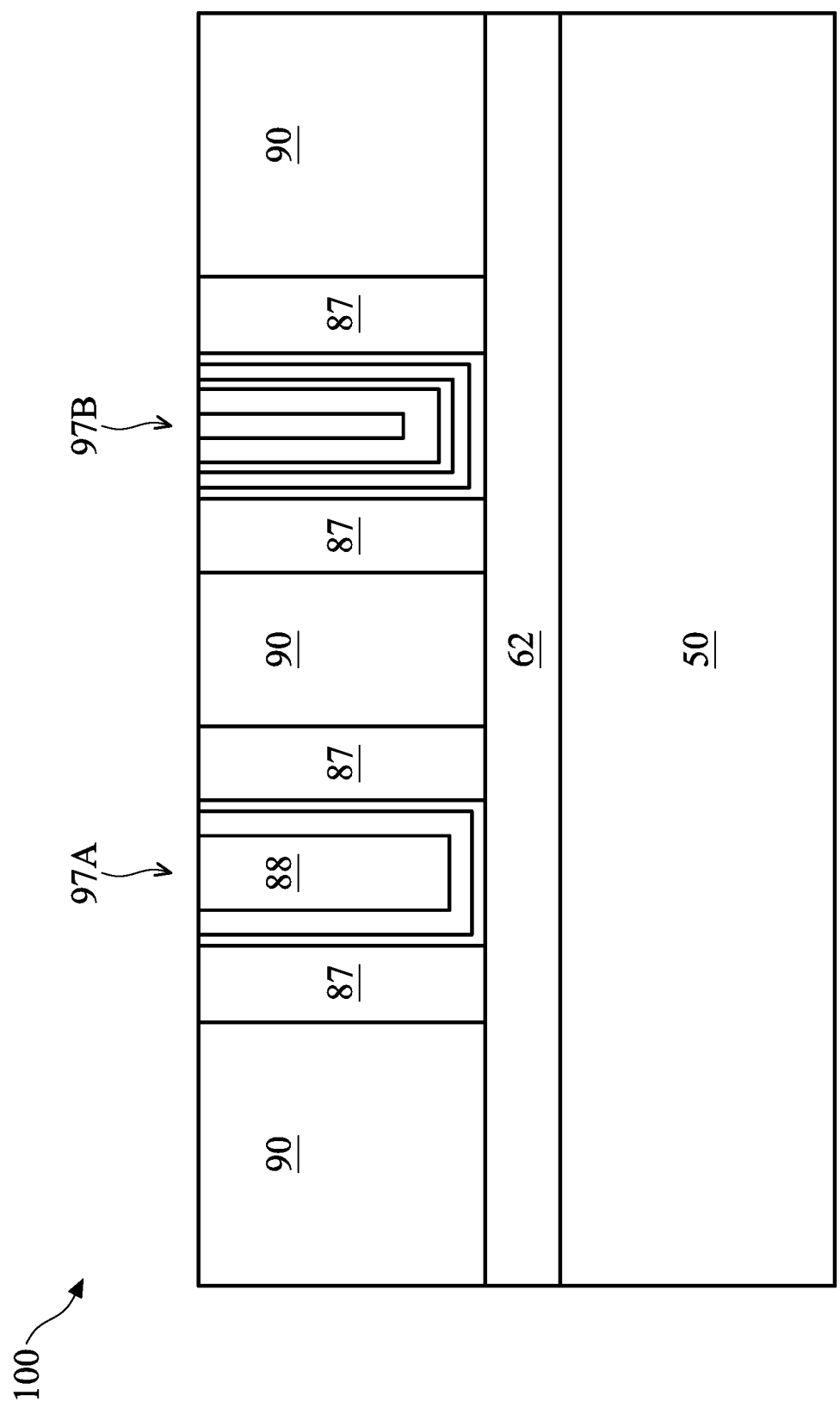

Next, in FIG. 14A, a fill metal 88 is formed over the second work function layer 86 and to fill the recesses 91A and 91B. The fill metal 88 may be made of a metal-containing material such as Cu, Al, W, the like, combinations thereof, or multilayers thereof, and may be formed by, e.g., electroplating, electroless plating, PVD, CVD, or other suitable method. In some embodiments, before the fill metal 88 is formed, a seed layer (not shown) such as a copper layer, is formed over the second work function layer 86 by a suitable deposition process such as ALD, and the fill metal 88 is then formed over the seed layer. Next, a planarization process, such as CMP, is performed to remove portions of the second work function layer 86, portions of the gate dielectric layer 82, portions of the oxide layer 85, and portions of the first work function layer 84 that are disposed over the upper surface of the first ILD 90. After the planarization process, remaining portions of the second work function layer 86 and the gate dielectric layer 82 in the recess 91A form the metal gate 97A (e.g., portions of 97A in the region 200), and remaining portions of the second work function layer 86, the oxide layer 85, the first work function layer 84, and the gate dielectric layer 82 in the recess 91B form the metal gate 97B (e.g., portions of 97B in the region 200).

FIG. 14B illustrates the FinFET device 100 of FIG. 14A, but along cross-section D-D (see FIG. 15). As illustrated in FIG. 14B, the metal gates 97 (e.g., 97A, 97B) are disposed over the isolation regions 62 and the substrate 50. Gate spacers 87 are on opposing sidewalls of each metal gate 97. The first ILD 90 surrounds the metal gates 97 and the gate spacers 87. Since the cross-section D-D is outside the semiconductor fins 64, features such as the semiconductor fins 64, the source/drain regions 80, and the LDD regions 65 may not be visible in the cross-sectional view of FIG. 14B.

In the example of FIG. 14A, the metal gate 97A has the first portion 86A of the second work function layer 86 with the thickness T1, and the metal gate 97B has the first work function layer 84 and the second portion 86B of the second work function layer 86 with the thickness T2. Due to the different structures and different thicknesses of the work function layers (e.g., 84, 86), the transistors that the metal gates 97A and 97B belong to have different threshold voltages. By tuning the parameters (e.g., flow rate of nitrogen, and/or duration) of the plasma process used to remove the patterned mask layer 83, the thickness T2 of the second portion 86B of the second work function layer 86 is easily modified, which allows the threshold voltage Vt of the corresponding transistor to be tuned easily in accordance with design specifications. In addition, since the oxide layer 85 is formed by the plasma process to remove the patterned mask layer 83, no extra processing step is needed to form the oxide layer 85. In other words, the formation of the oxide layer 85 and the removal of the patterned mask layer 83 are performed in a same processing step (e.g., by the plasma process). This advantageously saves manufacturing cost and time.

As describe above, after the first replacement gate process, the region 200 may be covered by a mask layer, and the second replacement gate process may be performed to replace portions of the dummy gate structure 75 in the region 300. Since the region 300 (e.g., a p-type device region) may be a different device region from the region 200 (e.g., an n-type device region), the number of work function layers, the materials of the work function layers, and/or the thicknesses of the work function layers may be tuned for the type of device to be formed in the region 300. Therefore, a same metal gates 97 (e.g., 97A or 97B in FIG. 15) may have different structures in the region 200 and the region 300. In other words, portions (e.g., 97A_1, or 97B_1) of a metal gate 97 in the region 200 may be different from portions (e.g., 97A_2, or 97B_2) of the metal gate 97 in the region 300. As an example, portions of the metal gate 97 in the region 200 and portions of the metal gate 97 in the region 300 may have different numbers of work function layers, or different materials for the work function layers. As another example, portions of the metal gate 97 in the region 200 and portions of the metal gate 97 in the region 300 may have the same number of work function layers with each work function layer being formed of a same work function metal, but at least one of the work function layers has different thicknesses in the region 200 and the region 300. In other embodiments, the metal gates 97 (e.g., 97A or 97B in FIG. 15) may have a same structures (e.g., as illustrated in FIG. 14A) in both the region 200 (e.g., an n-type device region) and the region 300 (e.g., a p-type device region), but the materials for the fins 64 in the regions 200 and 300 may be different to achieve different threshold voltages for the different types (e.g., n-type, or p-type) of devices formed, in which case the metal gates 97 in both the region 200 and the region 300 may be formed in a single replacement gate process instead of two separate replacement gate processes.

Referring now to FIG. 15, a plan view of the FinFET device 100 after the processing step of FIGS. 14A and 14B is illustrated. For simplicity, not all features of the FinFET device 100 are illustrated. For example, the gate spacers 87, the isolation regions 62, and the source/drain regions 80 are not illustrated in FIG. 15.

As illustrated in FIG. 15, the metal gates 97 (e.g., 97A/97B) straddle the semiconductor fins 64 (e.g., 64A/64B/64C/64D). In subsequent processing, a metal gate cutting process is performed to cut each of the metal gate 97 (e.g., 97B) into two separate metal gates (see, e.g., 97B_1 and 97B_2 in FIG. 17B). In the illustrated embodiment, a portion of the metal gates 97A/97B in a cut area 55 is removed, thereby separating each the metal gates 97A and 97B into two separate metal gates. For example, after the metal gate cutting process, portions of the metal gate 97B over the semiconductor fins 64A and 64B form the metal gate 91B_1, and portions of the metal gate 97B over the semiconductor fins 64C and 64D form the metal gate 97B_2. The metal gate 97B_1 and the metal gate 97B_2 may be controlled independently, e.g., by applying different control voltages to the metal gates 97B_1 and 97B_2.

FIG. 15 illustrates a non-limiting example of the cut area 55. The number of cut areas 55, the size of cut areas 55, and the location of cut areas 55 may be varied to achieve different cutting patterns and to form metal gates with different sizes and patterns. These and other variations of the cut areas 55 are fully intended to be included within the scope of the present disclosure. Discussions below use the example of one cut area 55 as illustrated in FIG. 15, with the understanding that any number of cut areas may be used in the fabrication of the FinFET device 100.

FIGS. 16A-18B illustrate cross-sectional views of the FinFET device 100 in a subsequent metal gate cutting process, in accordance with an embodiment. Referring now to FIGS. 16A and 16B, a mask layer 123, which may include a first hard mask layer 122 and a second hard mask layer 124, is formed over the FinFET device 100.

In some embodiments, the first hard mask layer 122 is a metal hard mask layer and the second hard mask layer 124 is a dielectric hard mask layer. The first hard mask layer 122 may be a masking material such as titanium nitride, titanium oxide, the like, or a combination thereof. The first hard mask layer 122 may be formed using a process such as ALD, CVD, PVD, the like, or a combination thereof. The second hard mask layer 124 is deposited over the first hard mask layer 122. The second hard mask layer 124 may be used as a masking pattern for the first hard mask layer 122. In subsequent processing steps, the second hard mask layer 124 is patterned to form patterns which may then be transferred to the first hard mask layer 122. The second hard mask layer 124 may be a masking material such as silicon nitride, silicon oxide, tetraethyl orthosilicate (TEOS), $SiO_xC_y$, the like, or a combination thereof. The second hard mask layer 124 may be formed using a process such as CVD, ALD, the like, or a combination thereof. In an embodiment, the first hard mask layer 122 comprises titanium nitride, and the second hard mask layer 124 comprises silicon nitride.

Next, a photoresist (not shown) is formed over the mask layer 123 and patterned. The pattern of the patterned photoresist is then transferred to the mask layer 123 using suitable methods, such as one or more anisotropic etching processes. As a result, a pattern 141 (e.g., an opening) is formed in the first hard mask layer 122 and the second hard mask layer 124. The pattern 141 corresponds to the cut area 55 in FIG. 15, and exposes portions of the metal gates 97A/97B within the cut area 55 (see FIG. 15). As illustrated in FIG. 16A, the pattern 141 also exposes the gate spacers 87 around the metal gates 97A/97B.

Next, as illustrated in FIGS. 16A and 16B, portions of the metal gates 97A/97B within the cut area 55 (see FIG. 15) and exposed by the pattern 141 are removed. A suitable etching process, such as an anisotropic etching process, may be performed to remove the exposed portions of the metal gates 97A/97B. After the portions of the metal gates 97A/97B within the cut area 55 are removed, recesses 140 (e.g., openings) are formed at locations where the removed portions of the metal gate 97A/97B used to be. As illustrated in FIG. 16B, the recesses 140 extend through the metal gates and expose portions of the isolation regions 62.

Next, as illustrated in FIGS. 17A and 17B, the recesses 140 are filled by a dielectric material 142. Suitable materials for the dielectric material 142 may include silicon nitride, silicon oxynitride, silicon carbide, combinations thereof, and the like, formed by PVD, CVD, ALD, or other suitable deposition method. After the dielectric material 142 fills the recesses 140, each of the metal gates 97A/97B is separated into two separate metal gates. FIG. 17B shows the two separate metal gates 97B_1 and 97B_2 formed by cutting the metal gate 97B. As discussed above, the metal gate 97B_1 in the region 200 may have different work function layers than the metal gate 97B_2 in the region 300. In the illustrated example of FIG. 17B, the metal gates 97B_1 and 97B_2 have the same structure, but the fins 64 in the regions 200 and 300 may have different materials to achieve different threshold voltages. For example, both the metal gate 97B_1 and 97B_2 have the gate dielectric layer 82, the first work function layer 84, the oxide layer 85, and the second work function layer 86. However, the fins 64 in the region 200 may be formed of a material (e.g., Si) that is different from the material (e.g., SiGe) of the fins 64 in the region 300.

Next, a planarization process, such as a CMP process, may be performed to remove the first hard mask layer 122, the second hard mask layer 124, and portions of the dielectric material 142 over the upper surface of the second hard mask layer 124.

Next, as illustrated in FIGS. 18A and 18B, contacts 102 are formed over and electrically connected to the metal gates 97 and to the source/drain region 80. To form the contacts 102, a second ILD 95 is formed over the first ILD 90. In some embodiments, the second ILD 95 is a flowable film formed by a flowable CVD method. In some embodiments, the second ILD 95 is formed of a dielectric material such as PSG, BSG, BPSG, USG, or the like, and may be deposited by any suitable method, such as CVD and PECVD. Next, contact openings are formed through the first ILD 90 and/or the second ILD 95 to expose the source/drain regions 80 and the metal gates 97, which contact openings are then filled with electrically conductive material(s) to form the contacts 102. In some embodiments, silicide regions 81 are formed over the source/drain regions 80 before the contact openings are filled. Details of forming the contacts 102 are discussed hereinafter.

In some embodiments, silicide regions 81 are formed over the source/drain regions 80. Silicide regions 81 may be formed by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the source/drain regions 80, then performing a thermal anneal process to form the silicide regions 81. The unreacted portions of the deposited metal are then removed, e.g., by an etching process. Although regions 81 are referred to as silicide regions, regions 81 may also be germanide regions, or silicon germanide regions (e.g., regions comprising silicide and germanide).

Next, a barrier layer 104 is formed lining sidewalls and bottoms of the contact openings, and over the upper surface of the second ILD 95. The barrier layer 104 may comprise titanium nitride, tantalum nitride, titanium, tantalum, the like, and may be formed by ALD, PVD, CVD, or other suitable deposition method. Next, a seed layer 109 is formed over the barrier layer 104. The seed layer 109 may be deposited by PVD, ALD or CVD, and may be formed of tungsten, copper, or copper alloys, although other suitable methods and materials may alternatively be used. Once the seed layer 109 has been formed, a conductive material 110 may be formed onto the seed layer 109, filling and overfilling the contact openings. The conductive material 110 may comprise tungsten, although other suitable materials such as aluminum, copper, tungsten nitride, rhuthenium, silver, gold, rhodium, molybdenum, nickel, cobalt, cadmium, zinc, alloys of these, combinations thereof, and the like, may alternatively be utilized. Any suitable deposition method, such as PVD, CVD, ALD, plating (e.g., electroplating), and reflow, may be used to form the conductive material 110.

Once the contact openings have been filled, excess portions of the barrier layer 104, seed layer 109, and conductive material 110 outside of the contact openings may be removed through a planarization process such as CMP, although any suitable removal process may be used. Contacts 102 are thus formed in the contact openings. The contacts 102 are illustrated in a single cross-section as an example, the contacts 102 could be in different cross-sections. In addition, in FIG. 18B, one contact 102 is shown connected to each of the two metal gate 97B_1 and 97B_2 as an example. The number and the location of the contacts 102 connected to each of the metal gates 97B_1 and 97B_2 may be changed without departing from the spirit of the present disclosure, these and other modifications are fully intended to be included within the scope of the present disclosure.

Variations to the disclosed embodiment are possible and are fully intended to be included within the scope of the present disclosure. For example, while two metal gates (e.g., 97A, 97B) are illustrated in FIG. 14A, more or less than two metal gates may be formed over the fin 64, and the thickness of the second work function layer 86 in each of the metal gates may be different, e.g., by performing the plasma process for each metal gate with different parameters (e.g., flow rate of nitrogen, duration of plasma process) while shielding the other metal gate from the plasma process. As another example, the oxide layer 85 may be formed by depositing an oxide over the first work function layer 84 (e.g., using CVD, PVD, ALD, or the like) instead of converting the surface layers of the first work function layer 84 into an oxide, this may be used when the material of the patterned mask layer 83 does not include oxygen.

Figure 19:
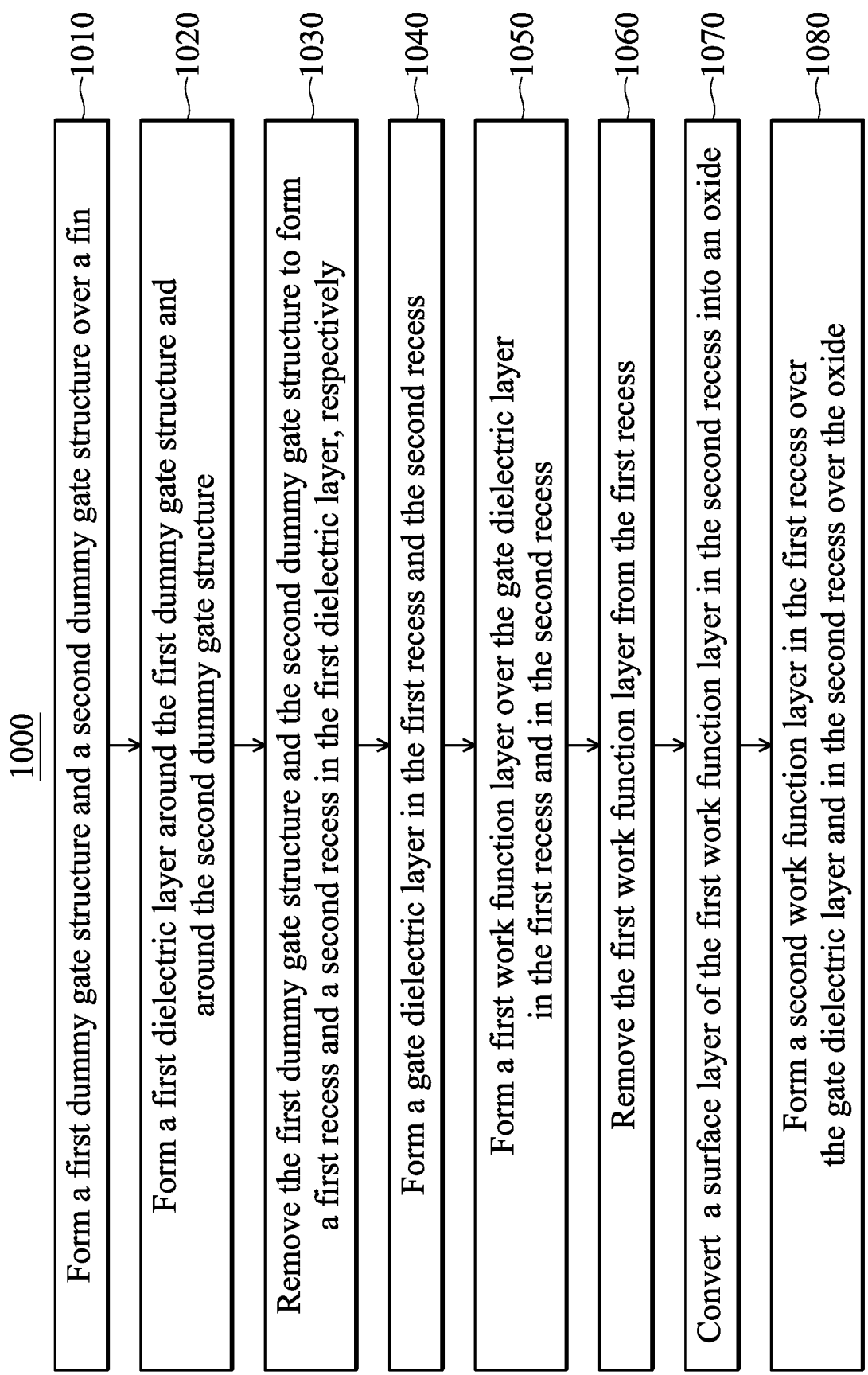
FIG. 19 illustrates a flow chart of a method of fabricating a semiconductor device, in accordance with some embodiments.

FIG. 19 illustrates a flow chart 1000 of a method of fabricating a semiconductor device, in accordance with some embodiments. It should be understood that the embodiment method shown in FIG. 19 is merely an example of many possible embodiment methods. One of ordinary skill in the art would recognize many variations, alternatives, and modifications. For example, various steps as illustrated in FIG. 19 may be added, removed, replaced, rearranged and repeated.

Referring to FIG. 19, at step 1010, a first dummy gate structure and a second dummy gate structure are formed over a fin. At step 1020, a first dielectric layer is formed around the first dummy gate structure and around the second dummy gate structure. At step 1030, the first dummy gate structure and the second dummy gate structure are removed to form a first recess and a second recess in the first dielectric layer, respectively. At step 1040, a gate dielectric layer is formed in the first recess and the second recess. At step 1050, a first work function layer is formed over the gate dielectric layer in the first recess and in the second recess. At step 1060, the first work function layer is removed from the first recess. At step 1070, a surface layer of the first work function layer in the second recess is converted into an oxide. At step 1080, a second work function layer is formed in the first recess over the gate dielectric layer and in the second recess over the oxide.

Embodiments may achieve advantages. By controlling the thickness of the work function layer (e.g., 86) in the semiconductor device, the present disclosure provides mechanisms to easily tune the threshold voltage of the semiconductor device formed. In some embodiments, controlling the thickness of the work function layer is achieved by tuning parameters of a plasma process used to remove the patterned mask layer (e.g., 83), and no addition processing step is needed to control the thickness of the work function layer in the semiconductor device, thereby achieving saving in the manufacturing cost and time.

In an embodiment, a method of forming a semiconductor device includes forming a first dummy gate structure and a second dummy gate structure over a fin; forming a first dielectric layer around the first dummy gate structure and around the second dummy gate structure; removing the first dummy gate structure and the second dummy gate structure to form a first recess and a second recess in the first dielectric layer, respectively; forming a gate dielectric layer in the first recess and the second recess; forming a first work function layer over the gate dielectric layer in the first recess and in the second recess; removing the first work function layer from the first recess; converting a surface layer of the first work function layer in the second recess into an oxide; and forming a second work function layer in the first recess over the gate dielectric layer and in the second recess over the oxide. In an embodiment, the second work function layer in the second recess over the oxide is thicker than the second work function layer in the first recess over the gate dielectric layer. In an embodiment, the method further comprises filling the first recess and the second recess with a conductive material to form a first metal gate and a second metal gate, respectively. In an embodiment, removing the first work function layer from the first recess comprises: forming a patterned mask layer in the second recess to cover the first work function layer in the second recess, wherein the first work function layer in the first recess is exposed by the patterned mask layer; performing an etching process to remove the exposed first work function layer in the first recess; and after performing the etching process, performing a plasma process to remove the patterned mask layer in the second recess. In an embodiment, performing the etching process comprises performing a wet etch process using an etchant that is selective to a material of the first work function layer. In an embodiment, the patterned mask layer comprises oxygen, and the plasma process generates oxygen species from the patterned mask layer, wherein converting the surface layer of the first work function layer comprises converting the surface layer of the first work function layer into the oxide using the oxygen species from the patterned mask layer. In an embodiment, converting the surface layer of the first work function layer and performing the plasma process are performed in a same processing step. In an embodiment, forming the first work function layer comprises forming a p-type work function layer. In an embodiment, forming the second work function layer comprises forming an n-type work function layer. In an embodiment, the second work function layer in the first recess has a first thickness different from a second thickness of the second work function layer in the second recess. In an embodiment, the first work function layer is formed using titanium silicon nitride, the second work function layer is formed using aluminum-doped titanium carbide, and the oxide is silicon oxide.

In an embodiment, a method of forming a semiconductor device includes forming a first dummy gate and a second dummy gate over a fin; forming an interlayer dielectric layer (ILD) around the first dummy gate and the second dummy gate; and replacing the first dummy gate and the second dummy gate with a first metal gate and a second metal gate, respectively, wherein the replacing comprises: removing the first dummy gate and the second dummy gate to form a first recess and a second recess in the ILD, respectively; forming a gate dielectric layer in the first recess and in the second recess; forming a first work function layer in the second recess over the gate dielectric layer, wherein the gate dielectric layer in the first recess is exposed by the first work function layer; forming a second work function layer in the first recess and in the second recess using a same deposition process, wherein the second work function layer is formed to be thicker in the second recess than in the first recess; and filling the first recess and the second recess with a conductive material. In an embodiment, forming the first work function layer in the second recess comprises: depositing the first work function layer in the first recess and in the second recess; forming a patterned mask layer to cover the first work function layer in the second recess; removing the first work function layer in the first recess; and removing the patterned mask layer. In an embodiment, the patterned mask layer comprises oxygen, wherein removing the patterned mask layer comprises performing a plasma process to remove the patterned mask layer, wherein the plasma process coverts a surface layer of the first work function layer into an oxide. In an embodiment, gases used in the plasma process are free of oxygen. In an embodiment, the plasma process is performed using gases comprising nitrogen, wherein the method further comprises changing a thickness of the second work function layer in the second recess by changing a flow rate of the nitrogen in the plasma process or by changing a duration of the plasma process.

In an embodiment, a semiconductor device includes a first metal gate structure over a fin, wherein the first metal gate structure comprises a gate dielectric layer over the fin, a first work function layer over and contacting the gate dielectric layer, an oxide over the first work function layer, a second work function layer over the oxide, and a fill metal over the second work function layer; a second metal gate structure over the fin and adjacent to the first metal gate structure, wherein the second metal gate structure comprises the gate dielectric layer over the fin, the second work function layer over and contacting the gate dielectric layer, and the fill metal over the second work function layer, wherein the second work function layer of the first metal gate structure is thicker than the second work function layer of the second metal gate structure; and a source/drain region over the fin and between the first metal gate structure and the second metal gate structure. In an embodiment, the first work function layer comprises titanium silicon nitride, and the second work function layer comprises aluminum-doped titanium carbide. In an embodiment, the second work function layer of the first metal gate structure has a first thickness, and the second work function layer of the second metal gate structure has a second thickness, the first thickness is larger than the second thickness by about 2 angstroms to about 3 angstroms. In an embodiment, the first metal gate structure and the second metal gate structure are in a same p-type device region or a same n-type device region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first dummy gate structure and a second dummy gate structure over a fin;
    forming a first dielectric layer around the first dummy gate structure and around the second dummy gate structure;
    removing the first dummy gate structure and the second dummy gate structure to form a first recess and a second recess in the first dielectric layer, respectively;
    forming a gate dielectric layer in the first recess and the second recess;
    forming a first work function layer over the gate dielectric layer in the first recess and in the second recess;
    removing the first work function layer from the first recess;
    converting a surface layer of the first work function layer in the second recess into an oxide; and
    forming a second work function layer in the first recess over the gate dielectric layer and in the second recess over the oxide.

2. The method of claim 1, wherein the second work function layer in the second recess over the oxide is thicker than the second work function layer in the first recess over the gate dielectric layer.

3. The method of claim 2, further comprising filling the first recess and the second recess with a conductive material to form a first metal gate and a second metal gate, respectively.

4. The method of claim 1, wherein removing the first work function layer from the first recess comprises:
forming a patterned mask layer in the second recess to cover the first work function layer in the second recess, wherein the first work function layer in the first recess is exposed by the patterned mask layer;
performing an etching process to remove the exposed first work function layer in the first recess; and
after performing the etching process, performing a plasma process to remove the patterned mask layer in the second recess.

5. The method of claim 4, wherein performing the etching process comprises performing a wet etch process using an etchant that is selective to a material of the first work function layer.

6. The method of claim 4, wherein the patterned mask layer comprises oxygen, and the plasma process generates oxygen species from the patterned mask layer, wherein converting the surface layer of the first work function layer comprises converting the surface layer of the first work function layer into the oxide using the oxygen species from the patterned mask layer.

7. The method of claim 6, wherein converting the surface layer of the first work function layer and performing the plasma process are performed in a same processing step.

8. The method of claim 1, wherein forming the first work function layer comprises forming a p-type work function layer.

9. The method of claim 8, wherein forming the second work function layer comprises forming an n-type work function layer.

10. The method of claim 9, wherein the second work function layer in the first recess has a first thickness different from a second thickness of the second work function layer in the second recess.

11. The method of claim 9, wherein the first work function layer is formed using titanium silicon nitride, the second work function layer is formed using aluminum-doped titanium carbide, and the oxide is silicon oxide.

12. A method of forming a semiconductor device, the method comprising:
forming a first dummy gate and a second dummy gate over a fin;
forming an interlayer dielectric layer (ILD) around the first dummy gate and the second dummy gate; and
replacing the first dummy gate and the second dummy gate with a first metal gate and a second metal gate, respectively, wherein the replacing comprises:
removing the first dummy gate and the second dummy gate to form a first recess and a second recess in the ILD, respectively;
forming a gate dielectric layer in the first recess and in the second recess;
forming a first work function layer in the second recess over the gate dielectric layer, wherein the gate dielectric layer in the first recess is exposed by the first work function layer;
forming a second work function layer in the first recess and in the second recess using a same deposition process, wherein the second work function layer is formed to be thicker in the second recess than in the first recess; and
filling the first recess and the second recess with a conductive material.

13. The method of claim 12, wherein forming the first work function layer in the second recess comprises:
depositing the first work function layer in the first recess and in the second recess;
forming a patterned mask layer to cover the first work function layer in the second recess;
removing the first work function layer in the first recess; and
removing the patterned mask layer.

14. The method of claim 13, wherein the patterned mask layer comprises oxygen, wherein removing the patterned mask layer comprises performing a plasma process to remove the patterned mask layer, wherein the plasma process coverts a surface layer of the first work function layer into an oxide.

15. The method of claim 14, wherein gases used in the plasma process are free of oxygen.

16. The method of claim 14, wherein the plasma process is performed using gases comprising nitrogen, wherein the method further comprises changing a thickness of the second work function layer in the second recess by changing a flow rate of the nitrogen in the plasma process or by changing a duration of the plasma process.

17. A method of forming a semiconductor device, the method comprising:
forming a first dummy gate structure and a second dummy gate structure over a fin, the first dummy gate structure and the second dummy gate structure being surrounded by a dielectric layer;
removing the first dummy gate structure and the second dummy gate structure to form a first recess and a second recess in the dielectric layer, respectively;
forming a gate dielectric layer in the first recess and the second recess;
forming a first work function layer in the second recess over the gate dielectric layer;
converting a surface layer of the first work function layer into an oxide layer;
forming a second work function layer in the first recess and the second recess, the second work function layer being over and contacting the gate dielectric layer in the first recess, the second work function layer being over and contacting the oxide layer in the second recess; and
filling the first recess and the second recess with a gate material to form gate electrodes.

18. The method of claim 17, wherein the second work function layer is formed to have a first thickness in the first recess and have a second thickness in the second recess, wherein the first thickness is smaller than the second thickness.

19. The method of claim 17, wherein forming the first work function layer in the second recess comprises:
forming the first work function layer in the first recess and the second recess;
forming a patterned mask layer over the first work function layer, wherein an opening of the patterned mask layer exposes the first work function layer in the first recess; and
removing the first work function layer from the first recess by performing an etching process using the patterned mask layer as an etching mask.

20. The method of claim 17, wherein the first dummy gate structure and the second dummy gate structure are in a same p-type device region or a same n-type device region.

* * * * *